(12) United States Patent
Inagi et al.

(10) Patent No.: US 11,657,321 B2
(45) Date of Patent: May 23, 2023

(54) INFORMATION PROCESSING DEVICE, NON-TRANSITORY STORAGE MEDIUM AND INFORMATION PROCESSING METHOD

(71) Applicant: KABUSHIKI KAISHA TOSHIBA, Minato-ku (JP)

(72) Inventors: Tatsuya Inagi, Kawasaki (JP); Myungsook Ko, Ota (JP); Arika Fukushima, Ota (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 1052 days.

(21) Appl. No.: 16/294,077

(22) Filed: Mar. 6, 2019

(65) Prior Publication Data
US 2019/0362262 A1   Nov. 28, 2019

(30) Foreign Application Priority Data

May 24, 2018   (JP) .............................. JP2018-099775

(51) Int. Cl.
*G06N 20/00* (2019.01)
*G06N 5/04* (2023.01)
*G06F 30/20* (2020.01)

(52) U.S. Cl.
CPC ............. *G06N 20/00* (2019.01); *G06F 30/20* (2020.01); *G06N 5/04* (2013.01)

(58) Field of Classification Search
CPC ........... G06N 20/00; G06N 5/04; G06F 30/20
See application file for complete search history.

(56) References Cited

U.S. PATENT DOCUMENTS 5,680,541 A   10/1997 Kurosu et al.
8,769,339 B2   7/2014 Sonoda et al.
(Continued)

FOREIGN PATENT DOCUMENTS

| CN | 107025153 A | 8/2017 |
|---|---|---|
| JP | 5-164800 | 6/1993 |

(Continued)

OTHER PUBLICATIONS

Takenori Oku, et al., "Predictive Maintenance for MFPs Using Big Data from @Remote", Ricoh Technical Report No. 43, Feb. 2018, 14 pages (with English Abstract & Machine Generated English Translation).

(Continued)

*Primary Examiner* — Hosuk Son
(74) *Attorney, Agent, or Firm* — Oblon, McClelland, Maier & Neustadt, L.L.P.

(57) ABSTRACT

According to one embodiment, information processing device includes a storage and a processing circuit. The storage is configured to store configuration data of a plurality of devices and error history data including a plurality of entries each with a type of error. The processing circuit is configured to: extract the entries with a specific type of error which are positive examples; extract the remaining entries which are negative examples; select a part of the negative examples with each type of error; generate learning data based on the positive examples, the selected negative examples and the configuration data at a time when the specific type of error occurred; and generate a diagnosis model for estimation of possibility the specific type of error occurs by using the learning data.

13 Claims, 23 Drawing Sheets

(56) References Cited

U.S. PATENT DOCUMENTS

| | | | |
|---|---|---|---|
| 9,588,876 B2* | 3/2017 | Swierc | G06F 11/3668 |
| 9,785,983 B2* | 10/2017 | Zhao | G06Q 30/04 |
| 9,967,413 B2 | 5/2018 | Hirama | |
| 10,025,657 B2 | 7/2018 | Oku et al. | |
| 10,817,394 B2* | 10/2020 | Oba | G06F 11/2257 |
| 10,817,750 B2* | 10/2020 | Hazard | G06N 20/00 |
| 11,262,742 B2* | 3/2022 | Srinivasamurthy | G06K 9/6271 |
| 2016/0216175 A1 | 7/2016 | Iwasaki et al. | |
| 2016/0352935 A1 | 12/2016 | Hirama | |
| 2016/0378584 A1 | 12/2016 | Oku et al. | |
| 2018/0137415 A1* | 5/2018 | Steinberg | G06N 20/00 |

FOREIGN PATENT DOCUMENTS

| | | |
|---|---|---|
| JP | 8-318296 A | 12/1996 |
| JP | 3090517 | 9/2000 |
| JP | 2011-145773 A | 7/2011 |
| JP | 5790891 | 10/2015 |
| JP | 2016-224690 | 12/2016 |
| JP | 2017-017611 | 1/2017 |

OTHER PUBLICATIONS

Koji Adachi, et al., "Fault Diagnostic Technology for Duplicator Machine by Bayesian Network", Fujixerox Technical Report No. 19, 2010, 22 pages (with English Abstract & Machine Generated English Translation).

"Fault Prediction Technology for Preventive Maintenance of Multifunctional Peripherals (MFPs)," Toshiba Review vol. 67, No. 12, 2012, 4 pages (with Machine Generated English Translation).

"The failure prediction solution of the smart infrastructure—OA equipment realized by "e-A.I. Artifical Intelligence"", Renesas Electronics Corporation, https://www.renesas.com/jp/ja/support/videos/solutions/fault-forecasting-solutions-office-autiomation.html, 2 pages (with Partial Machine Generated English Translation).

* cited by examiner

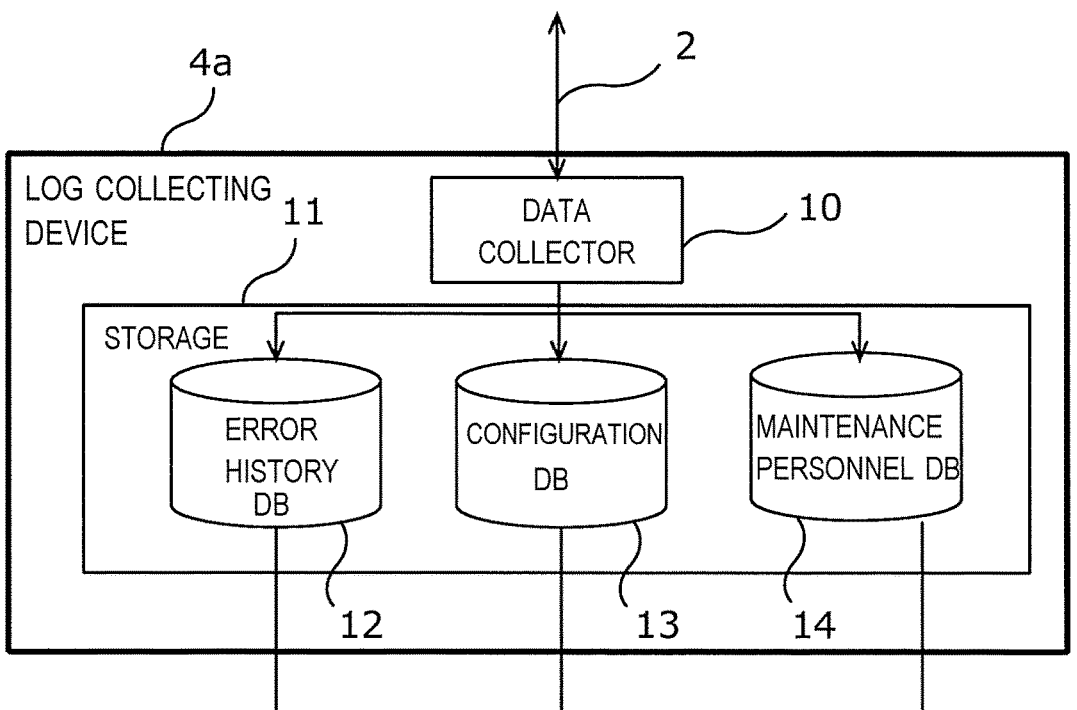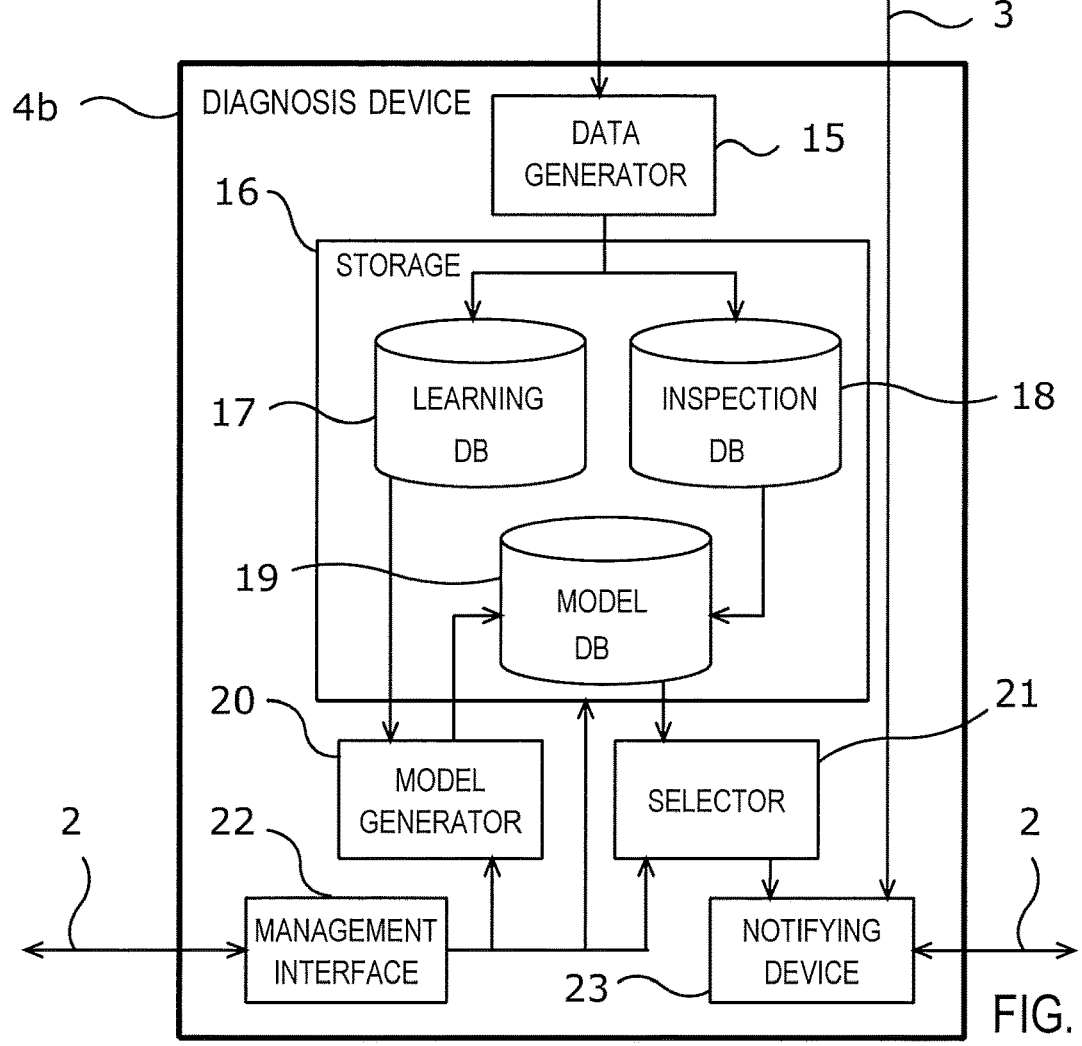
FIG. 2

ERROR HISTORY DATA

| LSN | SERIAL NUMBER | MODEL | TIMESTAMP | ERROR CATEGORY | ERROR CODE | ERROR LOCATION |
|---|---|---|---|---|---|---|
| 1 | A0011 | A1234-X | 2018/1/13 14:45 | JAMMING | 0x000A | CASSETTE |
| 2 | A0022 | A1234 | 2018/1/15 15:24 | JAMMING | 0x000B | FUSING |
| 3 | A0033 | A1234-X | 2018/1/18 10:25 | IMAGE ANOMALY | 0x000E | FUSING |
| 4 | A0011 | A1234 | 2018/1/21 9:46 | JAMMING | 0x000C | DOCUMENT FEEDER |
| 5 | A0022 | A1234 | 2018/1/23 11:02 | IMAGE ANOMALY | 0x000F | DOCUMENT FEEDER |
| 6 | A0033 | A1234-X | 2018/1/25 15:12 | IMAGE ANOMALY | 0x0011 | FAX |
| 7 | A0011 | A1234 | 2018/1/27 10:49 | OPERATION ANOMALY | 0x0012 | FINISHER |
| 8 | A0022 | A1234 | 2018/1/29 16:40 | OPERATION ANOMALY | 0x0013 | FAX |
| 9 | A0033 | A1234-X | 2018/1/30 13:25 | JAMMING | 0x000D | FINISHER |
| ... | ... | ... | ... | ... | ... | ... |

| ERROR CODE | ERROR CATEGORY | ERROR LOCATION | PROCEDURE OF PREVENTATIVE MAINTENANCE |
|---|---|---|---|
| ⋮ | ⋮ | ⋮ | ⋮ |
| 0x000A | JAMMING | CASSETTE | |
| 0x000B | JAMMING | FUSING | |
| 0x000C | JAMMING | DOCUMENT FEEDER | |
| 0x000D | JAMMING | FINISHER | |
| 0x000E | IMAGE ANOMALY | FUSING | |
| 0x000F | IMAGE ANOMALY | DOCUMENT FEEDER | |
| 0x0010 | IMAGE ANOMALY | FAX | |
| 0x0011 | OPERATION ANOMALY | FINISHER | |
| 0x0012 | OPERATION ANOMALY | FAX | |
| ⋮ | ⋮ | ⋮ | ⋮ |

ERROR DEFINITION DATA

| SERIAL NUMBER | MODEL | TIMESTAMP | ... | PHOTOSENSITIVE DRUM WEAR RATE (PRINTED SHEETS) | ... | TRANSFER ROLLER WEAR RATE (# OF OPERATIONS) | ... |
|---|---|---|---|---|---|---|---|
| A0011 | MODEL-A | 2018/1/13 14:45 | ... | 30% | ... | 30% | ... |
| A0022 | MODEL-A | 2018/1/15 15:24 | ... | 10% | ... | 20% | ... |
| A0033 | MODEL-A | 2018/1/18 10:25 | ... | 50% | ... | 40% | ... |
| A0011 | MODEL-A | 2018/1/21 9:46 | ... | 31% | ... | 30% | ... |
| A0022 | MODEL-A | 2018/1/23 11:02 | ... | 13% | ... | 13% | ... |
| A0033 | MODEL-A | 2018/1/25 15:12 | ... | 52% | ... | 52% | ... |
| A0011 | MODEL-A | 2018/1/27 10:49 | ... | 33% | ... | 33% | ... |
| A0022 | MODEL-A | 2018/1/29 16:40 | ... | 20% | ... | 20% | ... |
| A0033 | MODEL-A | 2018/1/30 13:25 | ... | 55% | ... | 55% | ... |
| ... | ... | ... | ... | ... | ... | ... | ... |

13b

FIG. 6   PARTS DATA

MAINTENANCE PERSONNEL DATA

14a

| SERIAL NUMBER | MAINTENANCE PERSON NAME | COMPANY/ ORGANIZATION | INSTALLED LOCATION | ... |
|---|---|---|---|---|
| A0011 | ○○○○ | ○○ | ○○ PREFECTURE ○○ CITY ○○ ○○BUILDING 3F | ... |
| A0022 | △△△△ | △△ | △△ PREFECTURE △△ TOWN △△ △TOWN OFFICE 2F | ... |
| A0033 | □□□□ | □□ | □□ PREFECTURE □□ CITY □□ □COMPANY □□ FACTORY | ... |
| ... | | | | ... |

MAINTENANCE CONTACT DATA

14b

| MAINTENANCE PERSON NAME | NOTIFICATION METHOD | DESTINATION OF NOTICE | ... |
|---|---|---|---|
| ○○○○ | E-MAIL | ○○○○@xxxx | ... |
| △△△△ | E-MAIL | △△△△@xxxx | ... |
| □□□□ | SHORT MAIL | xxx-xxxx-xxxx | ... |
| ... | | ... | |

FIG. 7

| # | CASSETTE CONFIGURATION | FIRST CASSETTE SHEETS | ... | MANUFACTURE DATE | FINISHER MODEL | FINISHER MANUFACTURE DATE | DOCUMENT FEEDER MODEL | DOCUMENT FEEDER MANUFACTURE DATE |
|---|---|---|---|---|---|---|---|---|
| 1 | 1,2,3,4 | REGULAR | ... | 2017 Feb | MODEL-FB | 2017 Jan | MODEL-D1 | 2016 Dec |
| 2 | 1,2,3 | REGULAR | ... | 2017 Mar | MODEL-FB | 2017 Jan | MODEL-D1 | 2016 Dec |
| 3 | 1,2,3 | REGULAR | ... | 2017 Mar | MODEL-FB | 2017 Feb | MODEL-D2 | 2017 Jan |
| 4 | 1,2,LARGE | CARDBOARD | ... | ... | ... | ... | ... | ... |
| ... | ... | ... | ... | ... | ... | ... | ... | ... |
| 201 | 1,2,LARGE | CARDBOARD | ... | 2016 Dec | MODEL-FC | 2016 Dec | MODEL-D2 | 2016 Dec |
| 202 | 1,2,3,4 | REGULAR | ... | 2017 Apr | MODEL-F1 | 2017 Mar | MODEL-D1 | 2017 Jan |
| 203 | 1,2,3,4 | REGULAR | ... | 2017 May | MODEL-FB | 2017 May | MODEL-D1 | 2017 Mar |
| 204 | 1,2,3,4 | REGULAR | ... | 2017 Jan | MODEL-FC | 2017 Jan | MODEL-D1 | 2016 Dec |
| ... | ... | ... | ... | ... | ... | ... | ... | ... |

17b

LEARNING DATA

FIG. 9

| # | FEED ROLLER WEAR RATE (RUNNING TIME) | PHOTOSENSTIVE DRUM WEAR RATE (PRINTED SHEETS) | PHOTOSENSTIVE DRUM WEAR RATE (RUNNING TIME) | TRANSFER ROLLER WEAR RATE (PRINTED SHEETS) | TRANSFER ROLLER WEAR RATE (RUNNING TIME) | FUSING BELT WEAR RATE (PRINTED SHEETS) | FUSING BELT WEAR RATE (RUNNING TIME) |
|---|---|---|---|---|---|---|---|
| 1 | 10% | 30% | 30% | 40% | 40% | 30% | 30% |
| 2 | 10% | 10% | 20% | 30% | 30% | 30% | 30% |
| 3 | 30% | 50% | 40% | 50% | 50% | 40% | 40% |
| 4 | 20% | 20% | 30% | 30% | 30% | 30% | 30% |
| ... | ... | ... | ... | ... | ... | ... | ... |
| 201 | 10% | 30% | 40% | 50% | 50% | 40% | 40% |
| 202 | 40% | 30% | 30% | 50% | 50% | 30% | 30% |
| 203 | 50% | 60% | 50% | 60% | 60% | 40% | 40% |
| 204 | 30% | 50% | 40% | 40% | 40% | 30% | 30% |
| ... | ... | ... | ... | ... | ... | ... | ... |

17c

LEARNING DATA

FIG. 10

| # | SERIAL NUMBER | OS | MAIN UNIT FW | ENGINE FW | SCANNER FW | FAX FW | DOCUMENT FEEDER FW | FINISHER FW | FEEDER FW | ... |
|---|---|---|---|---|---|---|---|---|---|---|
| 1 | A0011 | O10050 | M1005 | E09 | S15 | FA03 | DF08 | FIN303 | F07 | ... |
| 2 | A0012 | O10051 | M1006 | E10 | S15 | FA03 | DF09 | FIN303 | F07 | ... |
| 3 | A0013 | O10051 | M1006 | E10 | S15 | FA03 | DF10 | FIN303 | F07 | ... |
| 4 | A0014 | O10051 | M1007 | E10 | S15 | FA03 | DF10 | FIN303 | F07 | ... |
| 5 | A0015 | O10049 | M1004 | E08 | S15 | FA03 | DF09 | FIN303 | F07 | ... |
| ... | ... | | | | | | | | | |

INSPECTION DATA

FIG. 11

| # | ... | CASSETTE CONFIGURATION | FIRST CASSETTE SHEETS | ... | MANUFACTURE DATE | FINISHER MODEL | FINISHER MANUFACTURE DATE | DOCUMENT FEEDER MODEL | DOCUMENT FEEDER MANUFACTURE DATE |
|---|---|---|---|---|---|---|---|---|---|
| 1 | ... | 1,2,3,4 | REGULAR | ... | 2017 Feb | MODEL-FB | 2017 Jan | MODEL-D1 | 2016 Dec |
| 2 | ... | 1,2,3 | REGULAR | ... | 2017 Mar | MODEL-FB | 2017 Jan | MODEL-D1 | 2016 Dec |
| 3 | ... | 1,2,3 | REGULAR | ... | 2017 Mar | MODEL-FB | 2017 Feb | MODEL-D2 | 2017 Jan |
| 4 | ... | 1,2,LARGE | CARDBOARD | ... | 2017 Mar | MODEL-FB | 2017 Feb | MODEL-D2 | 2017 Jan |
| 5 | ... | 1,2,3,4 | REGULAR | ... | 2017 Jan | MODEL-FC | 2017 Jan | MODEL-D1 | 2016 Dec |
| ... | | | | | | | | | |

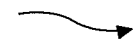

INSPECTION DATA

FIG. 12

INSPECTION DATA

| # | PAPER FEED ROLLER WEAR RATE (RUNNING TIME) | PHOTOSENSITIVE DRUM WEAR RATE (PRINTED SHEETS) | PHOTOSENSITIVE DRUM WEAR RATE (RUNNING TIME) | TRANSFER ROLLER WEAR RATE (PRINTED SHEETS) | TRANSFER ROLLER WEAR RATE (RUNNING TIME) | FUSING BELT WEAR RATE (PRINTED SHEETS) | FUSING BELT WEAR RATE (RUNNING TIME) |
|---|---|---|---|---|---|---|---|
| 1 | 20% | 40% | 20% | 30% | 40% | 20% | 20% |
| 2 | 15% | 20% | 30% | 30% | 35% | 30% | 25% |
| 3 | 10% | 15% | 20% | 20% | 30% | 30% | 35% |
| 4 | 40% | 35% | 35% | 40% | 40% | 20% | 20% |
| 5 | 30% | 40% | 40% | 45% | 50% | 40% | 45% |
| ... | ... | ... | ... | ... | ... | ... | ... |

CONFIGURATION OF DIAGNOSIS

○ THE DEVICES EXTRACTED IN DIAGNOSIS ARE DEVICES THAT PROBABILITY OF ERRORS BELONGING TO A SPECIFIC CATEGORY OCCURRING IS DETERMINED TO BE HIGH.

| | |
|---|---|
| DATE WHEN NEXT DIAGNOSIS IS EXECUTED | 2018-05-13 00:00 |
| INTERVAL OF DIAGNOSIS | 7 days |
| ERRORS WHICH ARE GOING TO BE DIAGNOSED | #1-#206 |

[UPDATE]   [CANCEL]

NOTIFIED 2018/XX/XX XX:XX

PREVENTIVE MAINTENANCE NOTIFICATION

MS: △△△△

PLEASE INSEPECT THE DOCUMENT FEEDER OF MODEL A1234-X SERIAL NUMBER A0154 INSTALLED IN △△PREFECTURE  △△CITY  △△ △ COORPORATION △WORKS △BUILDING.

PLEASE EXECUTE DIAGNOSIS COMMAND XXXX. IF XXX IS RETURNED, REPLACE XXX. IF RETURN CODE IS YYY, CLEAN YYY. IF RETURN CODE IS ZZZ, ADJUST THE LOCATION OF ZZZ.

INFORMATION PROCESSING DEVICE, NON-TRANSITORY STORAGE MEDIUM AND INFORMATION PROCESSING METHOD

CROSS-REFERENCE TO RELATED APPLICATIONS

This application is based upon and claims the benefit of priority from Japanese Patent Application No. 2018-099775, filed on May 24, 2018; the entire contents of which are hereby incorporated by reference.

FIELD

Embodiments described herein relate generally to an information processing device, a non-transitory storage medium and an information processing method.

BACKGROUND

For the customer support of devices such as multi-function peripherals, preventive maintenance is important to minimize the impacts to customers' businesses and the required cost. Therefore, if failures or issues are likely to occur for specific devices, the devices need to be specified beforehand. Then, preventive maintenance could be performed for the respective devices.

Methods to estimate the possibility that each type of error will occur, based on the operating history of each device is being developed. However, if the number of error types is large, the ratio between the positive examples and the negative examples become unbalanced in the learning data. Namely, the ratio of the number of negative examples divided by the number of positive examples becomes too large in the learning data. In such cases, the accuracy of the generated model suffers, making it difficult to specify the devices the possibility that each type of error will occur is high.

BRIEF DESCRIPTION OF THE DRAWINGS

FIG. 2 is a block diagram describing a configuration example of a log collecting device and a diagnosis device in accordance with the first embodiment;

FIG. 3 is a diagram presenting an example of error history data;

FIG. 6 is a diagram presenting an example of parts data;

FIG. 7 is a diagram presenting an example of maintenance personnel data and maintenance contact data;

FIG. 9 is a diagram presenting an example of learning data;

FIG. 10 is a diagram presenting an example of learning data;

FIG. 11 is a diagram presenting an example of inspection data;

FIG. 12 is a diagram presenting an example of inspection data;

FIG. 13 is a diagram presenting an example of inspection data;

FIG. 16 is a diagram illustrating an example of a configuration screen for diagnosis process;

DETAILED DESCRIPTION

According to one embodiment, information processing device includes a storage and a processing circuit. The storage is configured to store configuration data of a plurality of devices and error history data including a plurality of entries each with a type of error. The processing circuit is configured to: extract the entries with a specific type of error which are positive examples; extract the remaining entries which are negative examples; select a part of the negative examples with each type of error; generate learning data based on the positive examples, the selected negative examples and the configuration data at a time when the specific type of error occurred; and generate a diagnosis model for estimation of possibility the specific type of error occurs by using the learning data.

Hereinafter, embodiments of the present invention will be described with reference to the drawings.

First Embodiment

Figure 1:
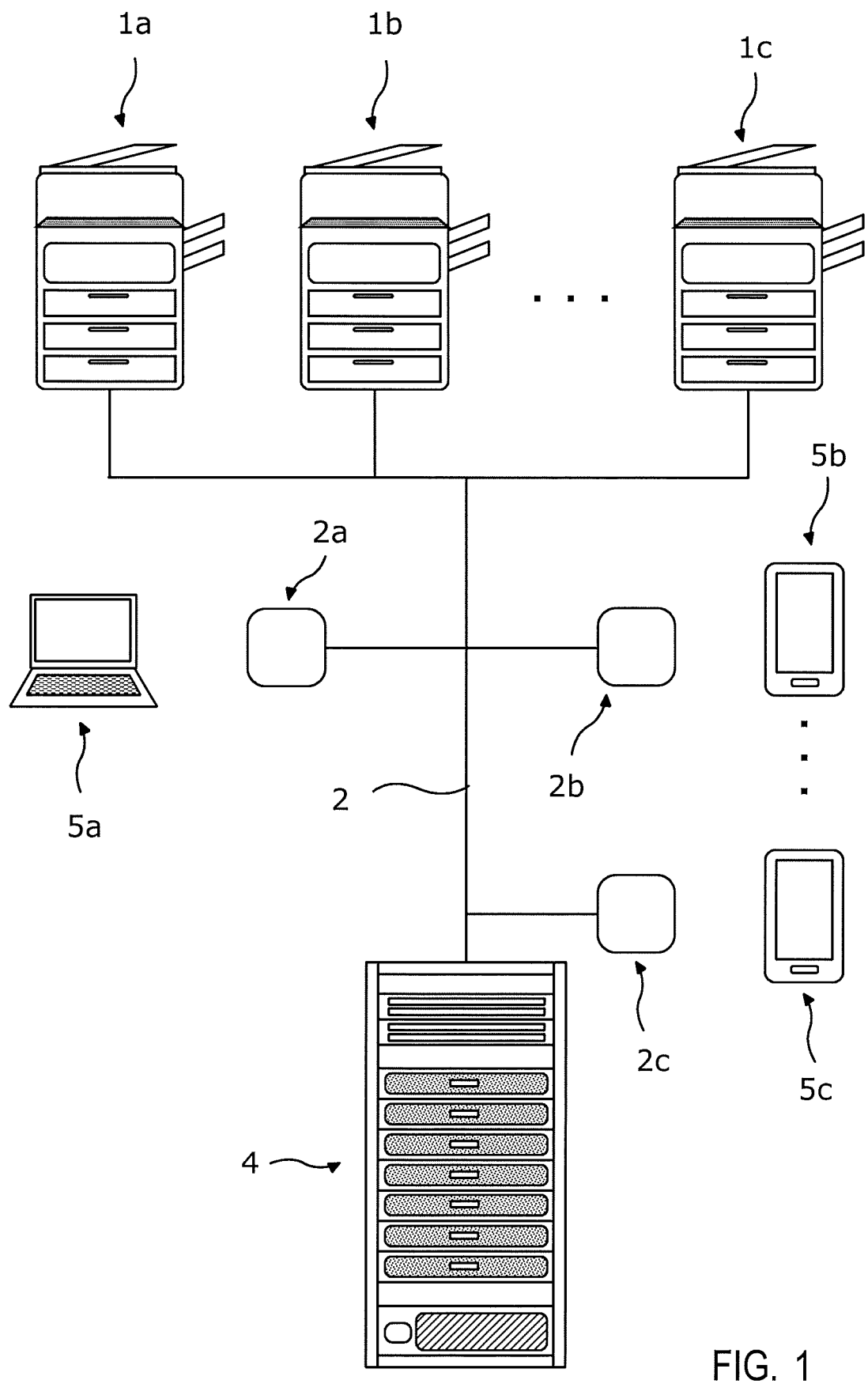
FIG. 1 is a diagram describing a configuration example of a diagnosis system in accordance with a first embodiment.

FIG. 1 is a diagram describing a configuration example of a diagnosis system in accordance with a first embodiment. A diagnosis system according to a first embodiment will be described with reference to FIG. 1.

The diagnosis system of FIG. 1 includes a multi-function peripheral 1a, a multi-function peripheral 1b, a multi-function peripheral 1c, a network 2, a wireless access point 2a, a wireless access point 2b, a wireless access point 2c, a server rack 4, a communication terminal 5a, a communication terminal 5b and a communication terminal 5c. Information appliances such as servers (computers), storage devices and switches are mounted on the server rack 4. The multi-function peripherals 1a, 1b, 1c, the base stations 2a, 2b, 2c and the information appliances in the server rack 4 are connected to each other by the network 2.

The multi-function peripherals 1a, 1b and 1c are examples of devices which are the subjects of preventative maintenance, in the diagnosis system according to the embodiment. The multi-function peripherals 1a, 1b and 1c are devices which integrate the features of business machines such as copying machines, printers, image scanners and facsimile machines in a single body. The combination of the features above is only an example. Thus, the multi-function peripherals 1a, 1b and 1c may have other features. Also, some of the features may be omitted.

In FIG. 1, three multi-function peripherals (1a, 1b and 1c) are shown. However, the number of multi-function peripherals is not limited. Therefore, the number of multi-function peripherals can be greater than the example of FIG. 1. For example, tens of thousands of multi-function peripherals can be the subjects of preventative maintenance. Multi-function peripherals of different types, different configurations, different models and different functions can be included in the subjects of preventative maintenance.

In the following, a case when multi-function peripherals are the subjects of preventative maintenance is explained as an example. However, other image forming devices can be included in the subjects of preventative maintenance. For example, printers and copying machines can be included in the subjects of preventative maintenance. Devices other than business machines can be the subjects of preventative maintenance. For example, automobiles, railway vehicles, construction machines, household appliances, medical equipment, processing equipment and other types of machines can be the subjects of preventative maintenance.

The network 2 enables communication of data between the connected devices. Examples of the communication medium used by the network 2 include optical fibers, LAN cables, telephone wires, coaxial cables and wireless. One example of the communication standard used by the network is Ethernet. However, any other communication standard can be used. Different types of communication mediums can be combined in the network 2. Also, a plurality of communication standards can be used in the network 2.

The base stations 2a, 2b and 2c are wireless communication devices with antennas. Communication terminals 5a, 5b and 5c can use wireless communication to establish connections with the network 2. The base stations 2a, 2b and 2c can be access points of wireless LAN including IEEE 802.11 series or their successor standards. Also, the base stations 2a, 2b and 2c can be base stations for mobile communication standards such as WiMAX, LTE or their successor standards. Thus, the type of wireless communication standard used by the base stations 2a, 2b and 2c are not limited. Also, not all the base stations need to use the same wireless communication standard. Base stations using different wireless communication standards can be installed.

In the server rack 4, a log collecting device 4a and a diagnosis device 4b of FIG. 2 are mounted. The log collecting device 4a and the diagnosis device 4b can be implemented by combining information appliances such as severs (computers), storage devices and switches. The log collecting device 4a collects data from the multi-function peripherals 1a, 1b and 1c. The log collecting device 4a generates diagnosis models based on the collected data. Also, the log collecting device 4a executes diagnosis of the multi-function peripherals 1a, 1b and 1c by using the generated diagnosis models. Details of the log collecting device 4a and the diagnosis device 4b are described later.

In the example of FIG. 1, only one server rack is illustrated. However, the information appliances can be installed on a plurality of server racks. The server racks can be installed in multiple sites such as machine rooms and data centers.

FIG. 1 is only one of the possible installations of the log collecting device 4a and the diagnosis device 4b. Thus, the log collecting device 4a and the diagnosis device 4b do not always need to be installed in server racks. For example, the functions of the log collecting device 4a and the diagnosis device 4b can be implemented by using personal computers in offices or control computers.

Communication terminals 5a, 5b and 5c are information processing devices with wireless communication features. Examples of information processing devices with wireless communication features include laptop computers, smartphones, tablets, smart watches and smart glasses. However, the type of device is not limited. The communication terminal 5a is a laptop computer. The communication terminals 5b and 5c are smartphones. The maintenance personnel can execute diagnosis of the assigned multi-function peripherals by using the communication terminals 5a, 5b and 5c. Also, maintenance personnel can also specify the multi-function peripherals preventative maintenance is required. Also, administrator of the diagnosis system can perform various operations or change the system settings by using the communication terminals. Although three communication terminals are illustrated in FIG. 1, the number of communication terminals is not limited. Also, the maintenance personnel and administrator can use personal computers which are electrically connected to the network 2. Thus, communication terminals which do not have wireless communication features can be used.

FIG. 2 is a block diagram describing a configuration example of a log collecting device and a diagnosis device in accordance with the first embodiment. In the following, an overview of the processes executed by the log collecting device 4a and the diagnosis device 4b are described.

The log collecting device 4a is an information processing device which obtains data from the multi-function peripherals which are subjects of preventative maintenance. Also, the log collecting device 4a stores the data obtained from the multi-function peripherals. The diagnosis device 4b selects the devices which are determined that the possibility that a specific type of error will occur is high, from a plurality of multi-function peripherals. The multi-function peripherals selected by the diagnosis device 4b are notified to the maintenance personnel as multi-function peripherals which need maintenance. Here, the term "maintenance" includes simple inspections of devices in the initial stages of the maintenance procedures. Thus, the diagnosis device 4b extracts multi-function peripherals which need maintenance to prevent the occurrence of specific types of errors.

Here, errors include various phenomena which may become issues for the customers. Examples of errors include failures occurring in the multi-function peripherals, abnormal behaviors of the multi-function peripherals, malfunctions, faults, end of lifetime for expendable supplies, the wear or deterioration of maintenance parts and detection of abnormal values.

As mentioned above, the number of multi-function peripherals which are the subjects of preventative maintenance may be in the order of tens of thousands or even more. Thus, if each of the components in all the multi-function peripherals are to be inspected, the cost and the workload required for preventative maintenance becomes unrealistically large. By using the diagnosis device according to the embodiment, the subjects for inspections are narrowed down to the multi-function peripherals which are determined that the possibility that a specific type of error will occur is high.

The diagnosis device 4b generates learning data from the data collected by the log collecting device 4a. Also, the diagnosis device 4b generates diagnosis models for each type of error which is going to be subject to diagnosis. Then, the diagnosis device 4b executes the diagnosis process by using the diagnosis model. In the diagnosis processes, multi-function peripherals which are determined that the possibility that each type of error will occur is high are specified, from the plurality of multi-function peripherals. The specified multi-function peripherals are notified to the maintenance personnel as the devices preventative maintenance is required. The maintenance personnel can inspect the specified multi-function peripherals depending on the notified type of error and messages. Also, the maintenance personnel can start the maintenance of the specified multi-function peripherals depending on the notified type of error and messages. The diagnosis device 4b may request inspections or certain maintenance tasks of specific components of the multi-function peripherals in the notified messages.

The log collecting device 4a and the diagnosis device 4b are connected to each other by the network 3. Examples of the network 3 include Ethernet using TCP/IP. However, any other type of interface can be used. Also, both the log collecting device 4a and the diagnosis device 4b are connected to the network 2.

The log collecting device 4a includes a data collector 10 and a storage 11. The storage 11 includes an error history database (error history DB) 12, a configuration database (configuration DB) 13 and a maintenance personnel database (maintenance personnel DB) 14 as internal components.

The data collector 10 collects data from each of the multi-function peripherals which are the subjects of preventative inspection. The data collector 10 can collect data directly from each of the multi-function peripherals. The data collector 10 can also obtain data which are collected by other monitoring servers. Examples of the data collected by the data collector 10 include error history data (for example, table 12a in FIG. 3), error definition data (for example, table 12b in FIG. 4), device configuration data (for example, table 13a in FIG. 5), parts data (for example, table 13b in FIG. 6), maintenance personnel data (for example, table 14a in FIG. 7) and maintenance contact data (for example, table 14b in FIG. 7). Details of the above data are described later.

The data collector 10 saves the error history data and the error definition data to the error history database 12. Also, the data collector 10 saves the device configuration data and the parts data to the configuration database 13. The data collector 10 saves the maintenance personnel data and the maintenance contact data to the maintenance personnel database 14.

The intervals between collection of data and the timings when data is collected by the data collector 10 are not limited. For example, the data collector 10 can update the error history data (obtain entries corresponding to newly occurring errors) during specific periods. Examples of the specific periods include 12 hours, 24 hours and 48 hours. The above periods are only examples. Thus, different lengths can be used for the periods. Also, the data collector 10 can update the error definition data in the error history database 12 once notification of an update has been received. Also, the data collector 10 can update the maintenance personnel data or the maintenance contact data in the maintenance personnel database 14 once notification of an update has been received.

The data collector 10 can update the device configuration data or the parts data of the configuration database 13 once notification that there has been a configuration change or replacement of parts for either of the multi-function peripherals. Here, updates include additions of new entries to the configuration database 13. The above notifications can be transmitted by each of the multi-function peripherals or management servers. Also, the data collector 10 can access the management server periodically. If there is updated data, the data collector 10 can download the corresponding data.

The storage 11 provides storage space for saving data collected by the data collector 10 and programs which operate on the data collecting device 4a. Any other data can be saved in the storage 11. Examples of storage 11 include volatile memory such as SRAM and DRAM. The storage 11 may be nonvolatile memory such as NAND flash memory, MRAM or FRAM. Also, the storage 11 may be HDDs, SSDs or external storage devices. However, the type of device used as the storage 11 is not limited. For example, the storage 11 may be a combination of different memories and storage devices.

At least part of the data stored in the storage 11 is accessible from the diagnosis device 4b. Here, access to the data includes data writes and data reads. The diagnosis device 4b can access the data stored in the storage 11 by using APIs (Application Programming Interfaces). The diagnosis device 4b can access the data stored in the storage 11 by using any other method.

Next, details of the data stored in the database of storage 11 are described.

The error history data and the error definition data are stored in the error history database 12. In the following, specific examples of the error history data and the error definition data are explained.

The error history data includes a list of errors which occurred in the plurality of multi-function peripherals and information on the types of errors. The table 12a in FIG. 3 is an example of the error history data. Each row in the table 12a corresponds to the entries in the error history data. Each entry indicates information of each error which occurred in a multi-function peripheral subject to preventative maintenance.

The first column of table 12a includes a LSN (log sequence number) which identifies each of the entries. The second column of the table 12a includes the serial number of the multi-function peripheral subject to preventative maintenance the error corresponding to the entry occurred. Since each of the serial numbers is unique, they can be used as the identifiers of each multi-function peripheral. The serial numbers can be numerical characters (numbers). Also, the serial number can be alphanumeric characters. The format used for the serial number is not limited. In the following, the identifiers of the multi-function peripherals are serial numbers. However, other information can be used as the identifiers of the multi-function peripherals. For example, the MAC address and positional data can be used as the identifiers of each multi-function peripheral.

The third column of the table 12a includes the model of the multi-function peripheral the error corresponding to the entry occurred. The fourth column of the table 12a includes the timestamp of the corresponding error. The timestamp of the error can be the time when the corresponding error occurred. Also, the timestamp of the error can be the time when the error was detected. The fifth column, the sixth column and the seventh column of the table 12a each include error categories, error codes and error locations. The error categories, the error codes and the error locations are types of errors defined based of different granularities or classifications. Details of the error categories, the error codes and the error locations are described later.

If errors occur in the multi-function peripherals which are the subjects of preventative maintenance, the log collector 10 of the log collecting device 4a adds an entry corresponding to the error in the error history data of the error history database 12.

Figure 4:
FIG. 4 is a diagram presenting an example of error definition data.

Table 12b of FIG. 4 is an example of error definition data. The error codes in the first column of table 12b indicate the types of errors in the finest granularities. The error categories in the second column of table 12b indicate the category each error code belongs to. Thus, the error categories describe the errors in larger granularities compared to the error codes. The error locations in the third column of table 12b classify errors based on the modules or parts where the errors occurred. The procedures of preventative maintenance in the fourth column of table 12b describe the maintenance procedures the maintenance personnel should follow to prevent the error corresponding to each error code from occurring.

The error definition data of table 12b is only an example. Therefore, it is possible to define the types of errors by using different criteria. The error definition data does not have to include all the items in FIG. 4. Also, the error definition data may include other items. For example, if the maintenance personnel can obtain the procedures of preventative maintenance by using other methods, the error definition data does not have to include the procedures of preventative maintenance.

The device configuration data and the parts data are stored in the configuration database 13. The device configuration data and the parts data are examples of configuration data. In the following, specific examples of the device configuration data and the parts data are described.

Figure 5:
FIG. 5 is a diagram presenting an example of device configuration data.

Table 13a in FIG. 5 is an example of the device configuration data. In each row (entry) of table 13a, information on the configuration of each multi-function peripheral is stored. The first column of table 13a includes the serial numbers of the multi-function peripherals. The second column of table 13a includes the models of the multi-function peripherals. The third column of table 13a includes the timestamp of the corresponding entry. In table 13a, configurations of multi-function peripherals with the serial numbers, "A0011", "A0022" and "A0033" obtained in a plurality of dates are stored. Therefore, it is possible verify whether there are configuration changes in each multi-function peripheral by referring to the table 13a. Here, examples of configuration changes include firmware updates and replacement of parts. Also, it is possible to obtain information on the configuration of the multi-function peripheral at a certain time.

The fourth column of table 13a includes the versions of the OS (operating system) used in the multi-function peripherals. The fifth column of table 13a includes the versions of the firmware used in the multi-function peripherals. The sixth column of table 13a includes the versions of the engine firmware used in the multi-function peripherals. The engine firmware controls the overall mechanisms of the multi-function peripherals. The seventh column of table 13a includes the versions of the scanner firmware used in the multi-function peripherals. The eighth column of table 13a includes the finisher model used in the multi-function peripherals. The finisher is an optional component attached to a side of the body of multi-function peripherals. The finisher executes operations including sorting operations of papers, stapling and hole punching. The ninth column of table 13a includes the document feeder model used in the multi-function peripherals. The document feeder is a device attached to the top side of the multi-function peripherals. The document feeder is configured to execute automatic scanning of papers.

The items included in the table 13a are only examples. Therefore, the device configuration data can include other items such as the hardware revision. Also, the device configuration data does not have to include all the items in the table 13a.

Table 13b in FIG. 6 is an example of parts data. The parts data includes information of expendable supplies which need to be replaced after usage for certain lengths of time. The parts data may include information of maintenance parts which are replaced, repaired or adjusted. Each row (entry) of table 13b corresponds to each multi-function peripheral subject to preventative maintenance. The first column of table 13b includes the serial numbers of the multi-function peripherals. The second column of table 13b includes the models of the multi-function peripherals. The third column of table 13b includes the timestamp of the corresponding entry. The timestamp of the corresponding entry can be the time when the data corresponding to the entry was obtained. In the table 13b, information of expendable supplies used in the multi-function peripherals with serial numbers "A0011", "A0022" and "A0033" are stored. Thus, by referring to the table 13b, it is possible to confirm whether there have been replacements of expendable supplies. Also, by referring to the table 13b, it is possible to obtain information on the wear rate of expendable supplies.

The parts data of table 13b includes the wear rate of photosensitive drums and transfer rollers. The wear rates of the photosensitive drums are estimated based on the number of printed sheets. The wear rates of the transfer rollers are estimated based on the number of operations. These items are only examples. The parts data does not have to include all the items mentioned above. Also, the parts data may include other items.

The maintenance personnel database 14 stores the maintenance personnel data and the maintenance contact data. In the following, specific examples of the maintenance personnel data and the maintenance contact data are described.

Table 14a in FIG. 7 is an example of the maintenance personnel data. In each row of table 14a, information of the maintenance personnel for each multi-function peripheral subject to preventative maintenance are stored. The first column of table 14a includes the serial numbers of the multi-function peripherals. The second column of table 14a includes the name of the maintenance person. The third column of table 14a includes the company or organization the maintenance person is belonging to. The fourth column of table 14a includes the location where the corresponding multi-function peripheral is installed. In the example of FIG. 7, the location where the multi-function peripheral is installed is specified by addresses, names of buildings and floor numbers.

Table 14b is an example of maintenance contact data. In each row of table 14b, information for contacting the maintenance person in charge of preventative maintenance is stored. In the first column of table 14b, the names of each maintenance person are stored. In the second column of table 14b, the methods for contacting each maintenance person are stored. In FIG. 7, e-mails and short mails are presented as examples. However, other methods such as telephone calls can be included in the examples. In the third column of table 14b, information on the destinations of notices is stored. In FIG. 7, e-mail addresses and telephone numbers are presented as examples.

In the following, components of the diagnosis device 4b are described in reference to FIG. 2.

The diagnosis device 4b includes a data generator 15, a storage 16, a model generator 20, a selector 21, a management interface 22 and a notifying device 23. The storage 16 has a learning database (learning DB) 17, an inspection database (inspection DB) 18 and a model database (model DB) 19 as internal components.

The data generator 15 generates the learning data by using the device configuration data and parts data stored in the configuration database 13 of the log collecting device 4*a*. The data generator 15 saves the generated learning data to the learning database 17. The processes executed by the data generator 15 are described below.

First, the data generator 15 extracts entries corresponding to either type of error from the error history data. The data generator 15 sets the extracted entries corresponding to a specific type of error as the positive examples. Also, the data generator 15 sets the entries corresponding to the remaining types of errors as the negative examples. For the entries set as the negative examples, the data generator 15 extracts a part of the entries for each type of error. Then, the data generator 15 generates the learning data based on the entries set as the positive examples, part of the negative examples and configuration data of a time when the specific type of error occurred.

For devices such as multi-function peripherals, errors of various types exist. Therefore, it is difficult to define a precisely "normal state" of the device. Depending on the type of errors, the location of occurrence, detected location, cause, impact, severity and frequencies of occurrence may vary. Therefore, the diagnosis device 4*b* generates the learning data by extracting entries from the operation history of the devices when each type of error occurred. The diagnosis device according to the embodiment generates learning data by using the configuration data at the times when the errors occurred. However, the learning data can be generated by using the configuration data at the times when there are no errors.

In the following, an example of the learning data generated by the data generator 15 is described.

Figure 8:
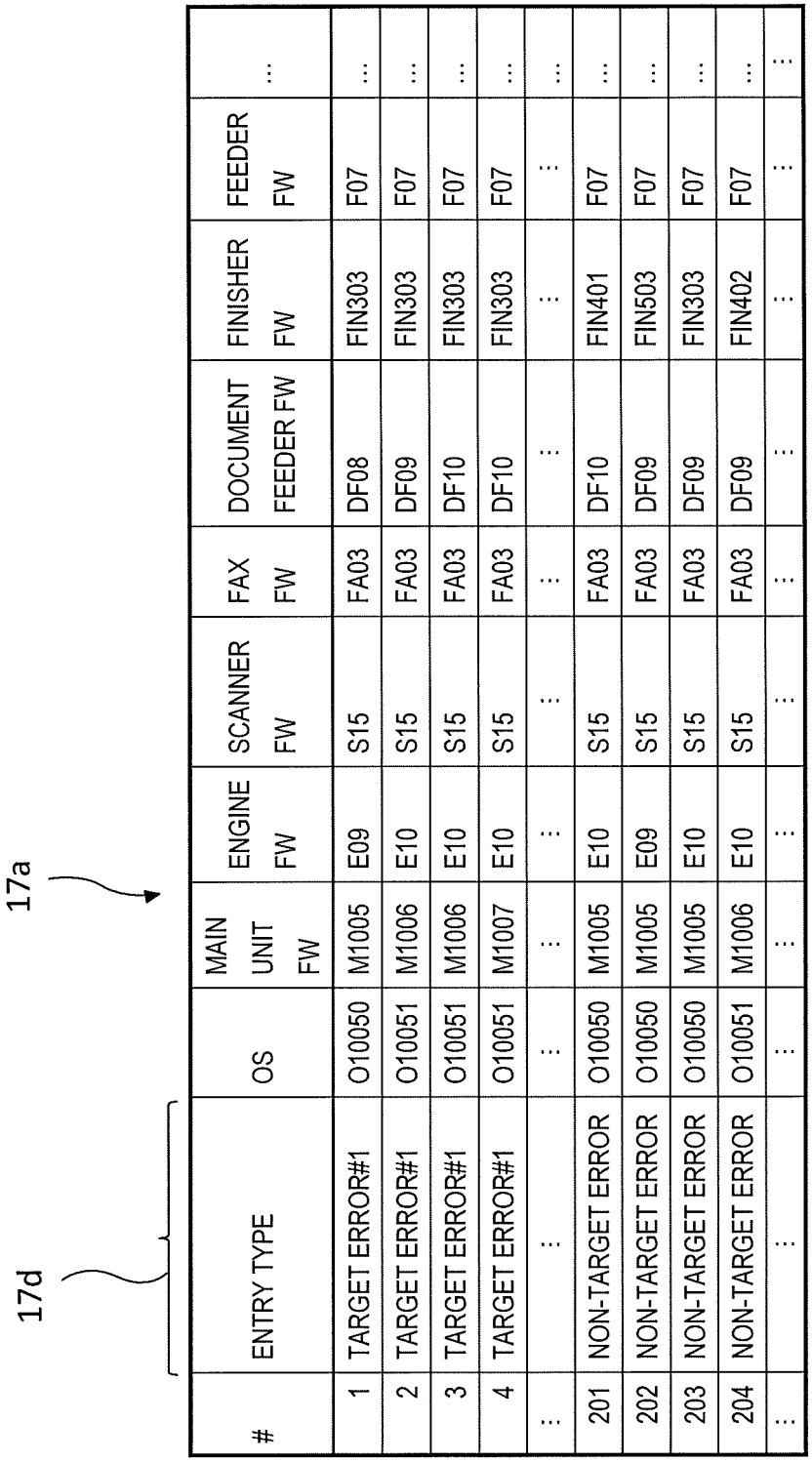
FIG. 8 is a diagram presenting an example of learning data.

Table 17*a* in FIG. 8, table 17*b* in FIG. 9 and table 17*c* in FIG. 10 store parts of the learning data. The tables 17*a*, 17*b* and 17*c* are actually parts of a single table storing the whole learning data.

Each column in tables 17*a* to 17*c* includes information including the configuration of multi-function peripherals and wear rates of expendable supplies when each error occurred. The first columns of tables 17*a* to 17*c* indicate the row numbers used as the identifiers of each entry. The second column (column 17*d*) of table 17*a* includes the entry types. The entry type indicates whether each indicates belongs to the positive examples or the negative examples during the learning process of diagnosis models.

The entry type is used as the teaching signal during the learning process of diagnosis models. The "target error #1" in the "entry type" column (column 17*d* of table 17*a*) indicates that the possibility that the corresponding type of error will occur is being estimated (predicted) by the diagnosis model generated by using the corresponding learning data. Entries with the entry type "target error #1" are used as the positive examples in the learning data.

It is possible to set the entries which include information on the configuration of devices when errors of specific error codes occurred, as the positive examples (entry type is set as, "target error"). Also, it is possible to set the entries which include information on the configuration of devices when errors of specific error categories or error locations occurred, as the positive examples (entry type is set as, "target error"). It is possible to determine the granularity of errors and classification of errors occurring at the entries which are set as the positive examples, depending on the type of error which needs to be prevented.

The "non-target error" includes types of errors which are not set as the type of error possibility of occurrence is estimated (predicted) by the generated diagnosis model. Thus, entries with the entry type, "non-target error" correspond to the entries which are used as the negative examples in the learning data. Each item in the learning data, besides the "entry type" is converted to numbers (numeric characters). Then, it is possible to use the items as explanatory variables (feature values). Details of the process of generating learning data are described later.

The storage 16 provides storage space for saving data used in the generation of diagnosis models and programs which operate on the diagnosis device 4*b*. Any other data can be saved in the storage 16. Examples of storage 16 include volatile memory such as SRAM and DRAM. The storage 16 may be nonvolatile memory such as NAND flash memory, MRAM or FRAM. Also, the storage 16 may be HDDs, SSDs or external storage devices. However, the type of device used as the storage 16 is not limited. For example, the storage 16 may be a combination of different types of memories and storage devices.

Next, the data stored in each of the databases of storage 16 is described.

Learning data is stored in the learning database 17. Details of the learning data were mentioned in the description of FIG. 8 to FIG. 10. Since the data generator 15 generates learning data for each type of error which is going to be diagnosed, tables of learning data used for generating diagnosis models for each type of error are stored in the learning database 17.

Inspection data is stored in the inspection database 18. The inspection data can be generated from data obtained from multi-function peripherals which are not in "error states" of the diagnosed type of error. The inspection data can be also generated from data obtained from multi-function peripherals errors corresponding to the diagnosed type of error have not occurred in the past. Besides the fact that the "entry type" column is missing, the inspection data have formats which are similar to the learning data. The inspection data is entered to the diagnosis model. Table 18*a* in FIG. 11, table 18*b* in FIG. 12 and table 18*c* in FIG. 13 are examples of tables storing the inspection data. The tables 18*a*, 18*b* and 18*c* are actually parts of a single table storing the whole inspection data.

The second column (column 18*d*) of table 18*a* includes the serial numbers of the multi-function peripherals. Therefore, each entry (row) of the inspection data corresponds to the data obtained from each multi-function peripheral subject to preventative maintenance. Each item in the entries except the serial number corresponds to the explanatory variables (feature values). Namely, the entries of the inspection data are sets of explanatory variables for each multi-function peripheral.

The diagnosis models generated by the model generator 20 are stored in the model database 19. Since diagnosis models can be generated for each type of error, it is possible to save a plurality of diagnosis models in the model database 19.

The model generator 20 generates a diagnosis model by using the learning data. For example, the model generator 20 can execute supervised learning to generate a diagnosis model. The model generator 20 can use various machine learning methods including L1 regularization, L2 regularization, logistic regression and various linear regression methods for generating the diagnosis model. One example of a logistic regression method is Elastic Net which includes the regularization term. Also, the model generator 20 can use neural networks, support vector machines, regression trees and random forests to generate a diagnosis model. The methods which can be used for generating the diagnosis model are not limited.

The selector 21 determines the multi-function peripheral which requires preventative maintenance. Specifically, the selector 21 enters each entry of the inspection data to the diagnosis model. Based on the output value of the diagnosis model, the selector 21 can specify the multi-function peripheral which requires preventative maintenance. Since each entry of the inspection data corresponds to each multi-function peripheral, the output values obtained when the explanatory variables of each entry are entered to the diagnosis model indicate the possibility that a specific type of error will occur in each multi-function peripheral. It is determined that the greater the output value of diagnosis model is, the more likely the corresponding type of error will occur in the corresponding device. Therefore, the selector 21 can compare the output value of each entry with a threshold value. Thus, the selector 21 can select the multi-function peripheral corresponding to the entry with an output value exceeding the threshold value as the multi-function peripheral which requires preventative maintenance.

In the above example, the output values of the diagnosis model were continuous values which indicate the possibility that a specific type of error will occur. However, the selector 21 can provide different outputs, depending on the method which is used. Thus, various criteria can be used to obtain the results. For example, if the diagnosis model classifies the entry to specific classes, the results can be determined based on the classified classes. Also, the distances to various clusters of data samples can be used in the diagnosis model. If neural networks are used, output values are obtained for each cell in the output layer. Each cell in the output layer may correspond to different classes and categories. Thus, the output values in each of the cells can be compared with the threshold values to obtain the results.

The management interface 22 provides an interface for the administrator to operate the diagnosis system. Also, the management interface 22 provides an interface for the administrator to change settings. Examples of the operations performed by the administrator include generation of diagnosis models. Details on the operation of the diagnosis model and changes of settings are described later.

The notifying device 23 notifies information of the multi-function peripherals preventative maintenance is required. Specifically, the notifying device receives a list of selected multi-function peripherals which are subject to preventative maintenance. Also, the notifying device 23 refers to the maintenance personnel data of the maintenance personnel database 14. Then, the notifying device 23 specifies the maintenance person who is in charge of each multi-function peripheral included in the list. The notifying device 23 refers to the maintenance contact data in the maintenance personnel database 14 to notify each maintenance person information on the multi-function peripherals preventative maintenance are required. The information can be notified to each maintenance person by using methods such as e-mails, short mails, telephone calls, voice calls, video messages or any other method.

The configurations of the log collecting device 4a and the diagnosis device 4b in FIG. 2 are only examples. For example, the functions of the log collecting device 4a and the diagnosis device 4b can be implemented in a single information processing device. Also, the features of the log collecting device 4a and the diagnosis device 4b can be implemented to a plurality of information processing devices. Also, the locations of each database can be different from the example of FIG. 2. Also, a plurality of databases can be located in a single storage device.

The components including the data collector 10, the data generator 15, the model generator 20, the selector 21, the management interface 22 and the notifying device 23 can be implemented with hardware circuitry such as semiconductor circuits, FPGA, PLD and ASIC. The above components can be implemented with software (programs) operating on the microprocessors. Also, the combination of above can be used to implement the components. Here, hardware circuitry and microprocessors are examples of the processing circuit.

Next, the overall process executed by the diagnosis system according to the embodiment is described.

Figure 14:
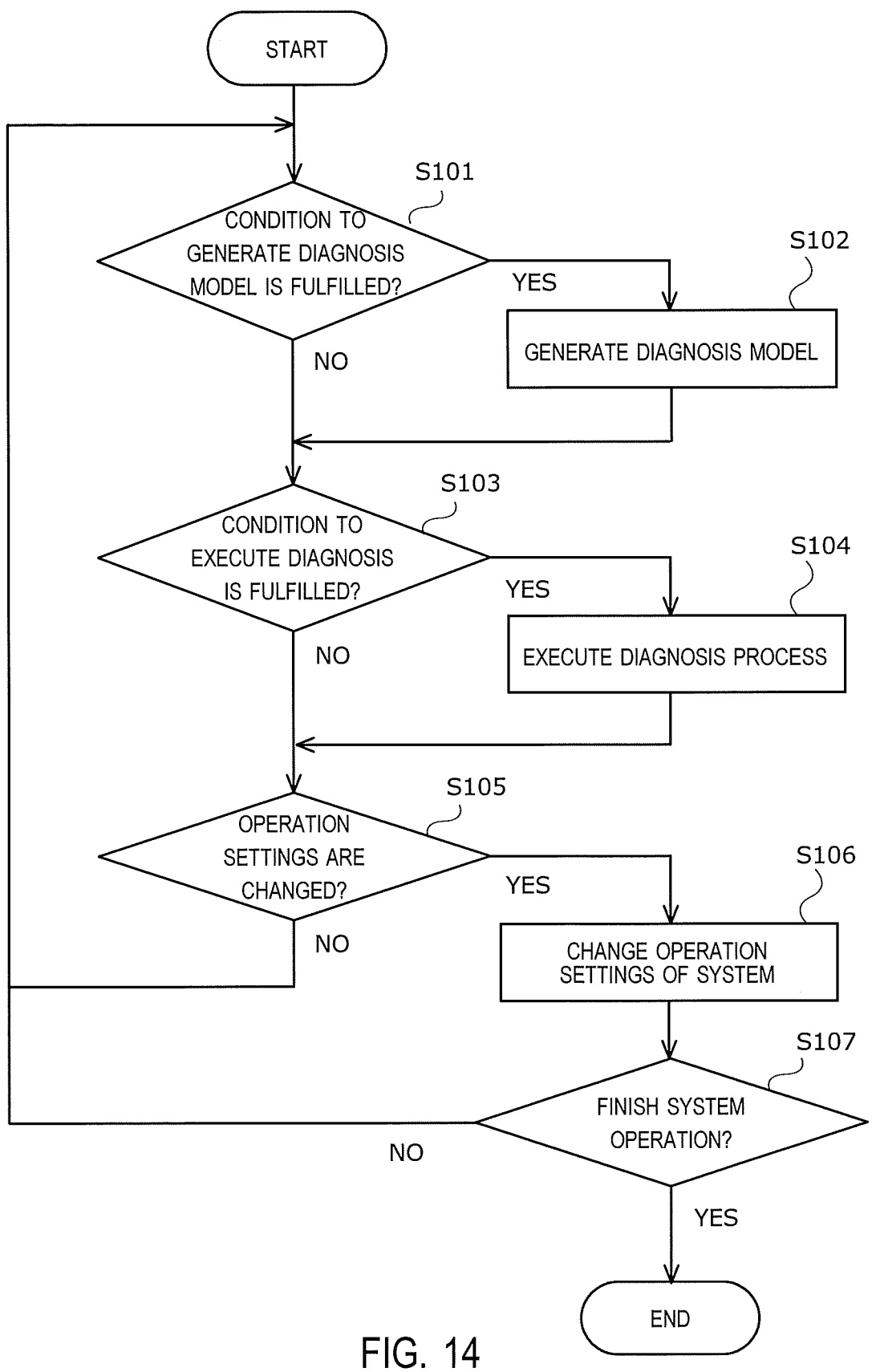
FIG. 14 is a flowchart describing an example of the process executed by the diagnosis system.

FIG. 14 is a flowchart describing an example of the process executed by the diagnosis system. In the following, the process is explained with reference to FIG. 14.

First, it is determined whether the condition to generate the diagnosis model is fulfilled (step S101). If the condition to generate the diagnosis model is fulfilled (YES in step S101), the diagnosis device 4b generates the diagnosis model (step S102). If the condition to generate the diagnosis model is not fulfilled, the diagnosis device 4b determines whether the condition to execute the diagnosis process is fulfilled (step S103).

Figure 15:
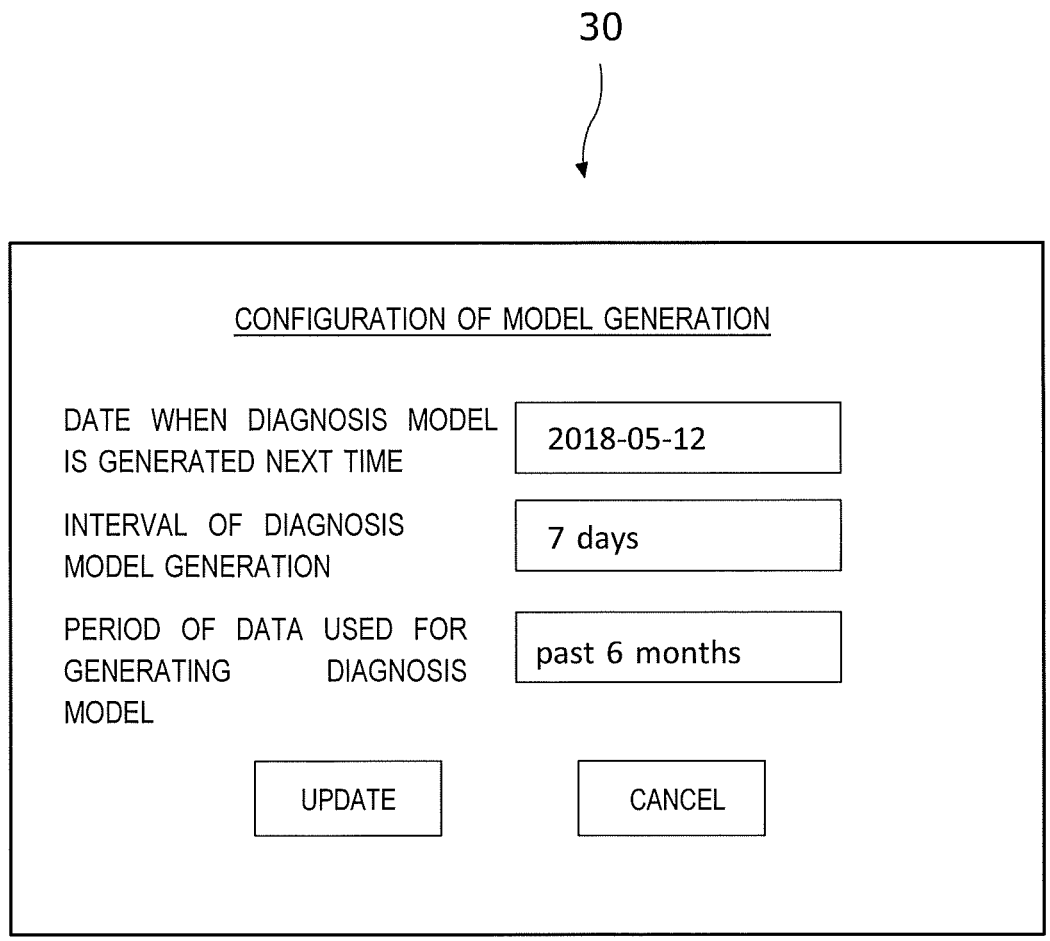
FIG. 15 is a diagram illustrating an example of a configuration screen for generation of models.

If the administrator sent instructions for generating the diagnosis model to the management interface 22, the diagnosis device 4b determines that the condition to generate the diagnosis model is fulfilled (YES in step S101). Also, the administrator can manipulate the interface provided by the screen 30 of FIG. 15 to ensure that the diagnosis model is generated by the diagnosis device 4b in a specified timing. The administrator can specify the date and time when the diagnosis model is generated the next time by using the screen 30. Also, the administrator can specify the intervals between the generations of diagnosis models. Also, the administrator can specify configuration data used for generating the diagnosis model by entering the period when the configuration data has been obtained.

If the condition to execute the diagnosis process is fulfilled (YES in step S103), the diagnosis device 4b executes the diagnosis process (step S104). If the condition to execute the diagnosis process is not fulfilled (NO in step S103), the diagnosis device 4b confirms whether the operation settings have been changed (step S105).

If the administrator sent instructions for executing the diagnosis process, the diagnosis device 4b determines that the condition to execute the diagnosis device is fulfilled (YES in step S103). Also, the administrator can manipulate the interface provided by the screen 31 of FIG. 16 to ensure that the diagnosis process is executed by the diagnosis device 4b in a specified timing.

The administrator can specify the date and time when the diagnosis process is executed in the next time by using the screen 31. Also, the administrator can specify the intervals between the executed timings of diagnosis process, by using the screen 31. Also, the administrator can specify the type of errors which are going to be diagnosed. For example, the types of error can be specified by error codes, or any other method. Also, the multi-function peripherals which are subjects of preventative maintenance and diagnosed can be specified by using serial numbers.

Figure 17:
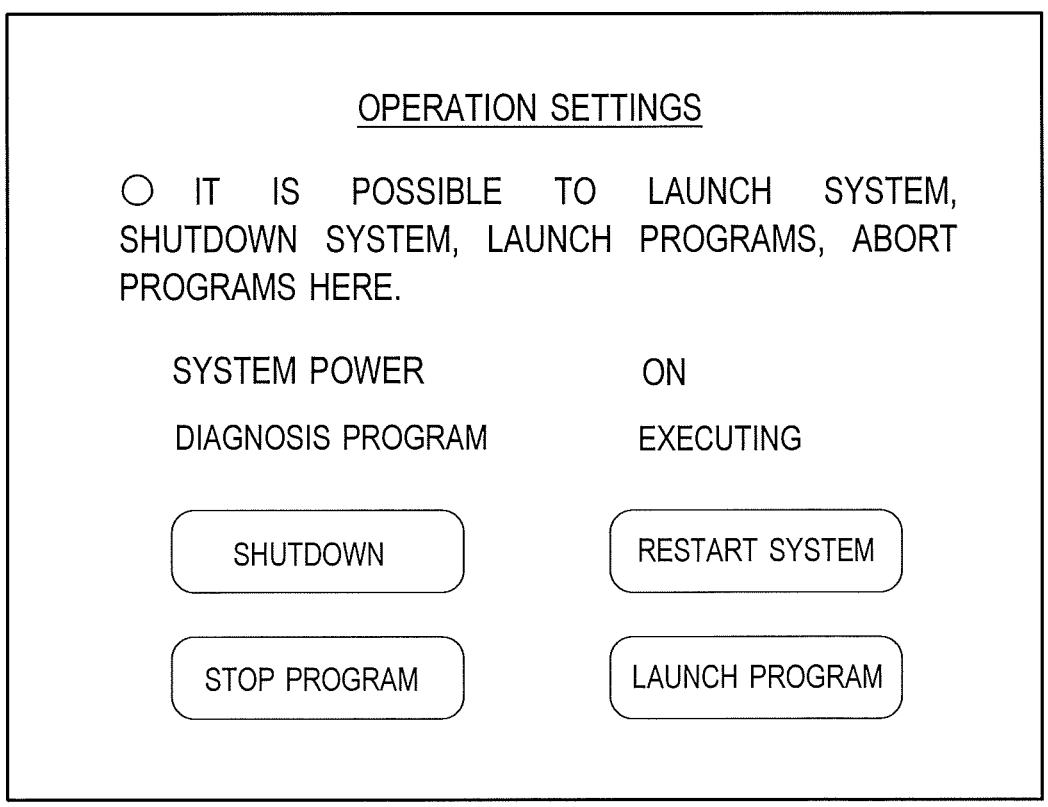
FIG. 17 is a diagram illustrating an example of a system operation screen.

If it is determined that operation settings have been changed (YES in step S105), the diagnosis device 4b changes the operation settings of the system (step S106). If it is determined that there are no changes in the operation settings (NO in step S105), the diagnosis device 4b executes the processes of step S101 and the following steps, again. The administrator can execute operations including the system shutdowns, system restarts, launching of the diagnosis program and stopping of the diagnosis program by using the screen 32 in FIG. 17.

If the operation setting of the system is changed (step S106), it is determined whether the operation of system is finished or not (step S107). If either the system shutdown operation, system restart operation or the stop diagnosis program operation is selected in screen 32 (YES in step S107), the process of flowchart (FIG. 14) is finished.

If the system shutdown operation, system restart operation or the stop diagnosis program operation are not selected in screen 32 (NO in step S107), the diagnosis device 4b executes the processes of step S101 and the following steps, again.

Figure 18:
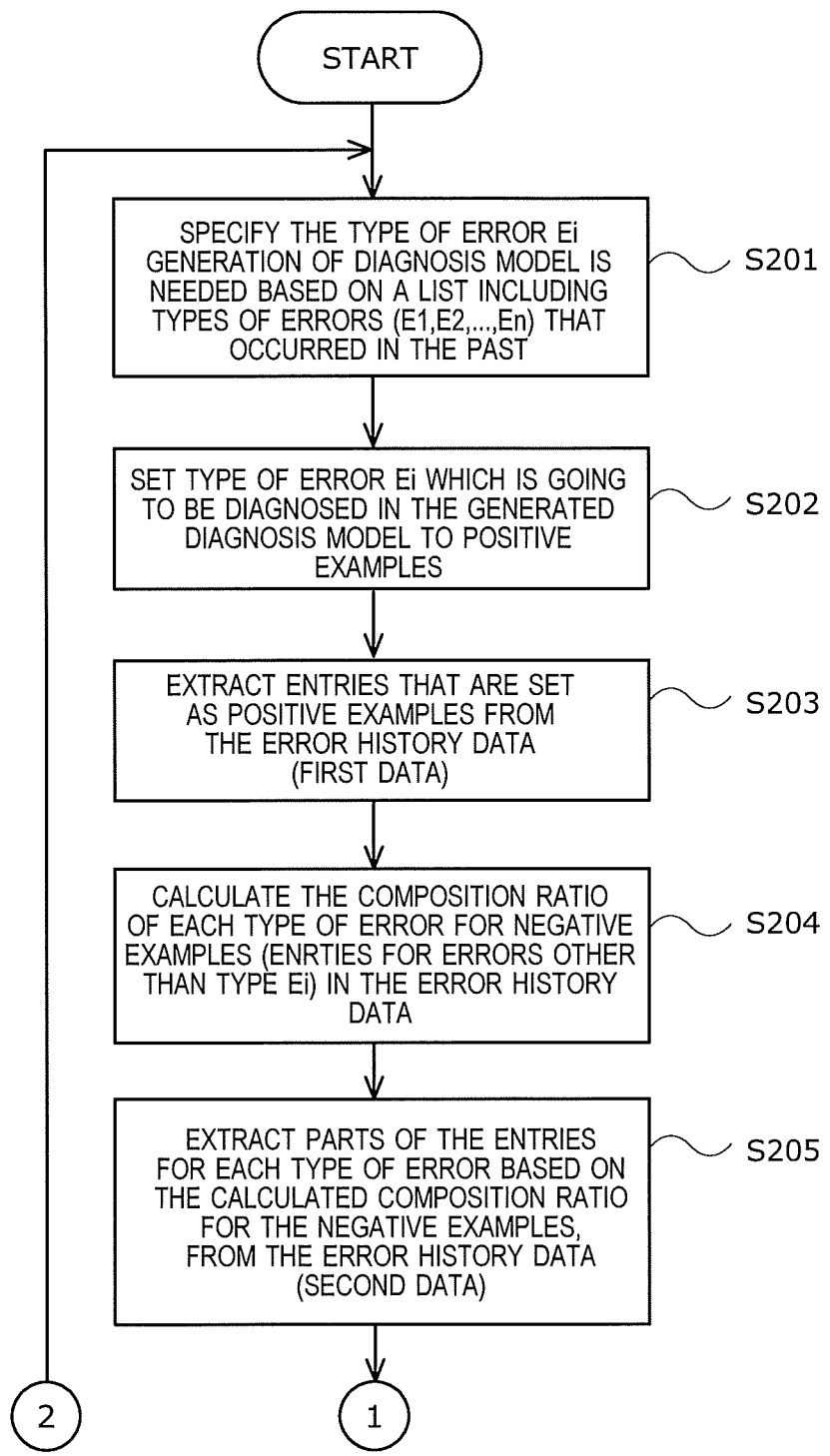
FIG. 18 is a flowchart describing an example of a diagnosis model generation process.
Figure 19:
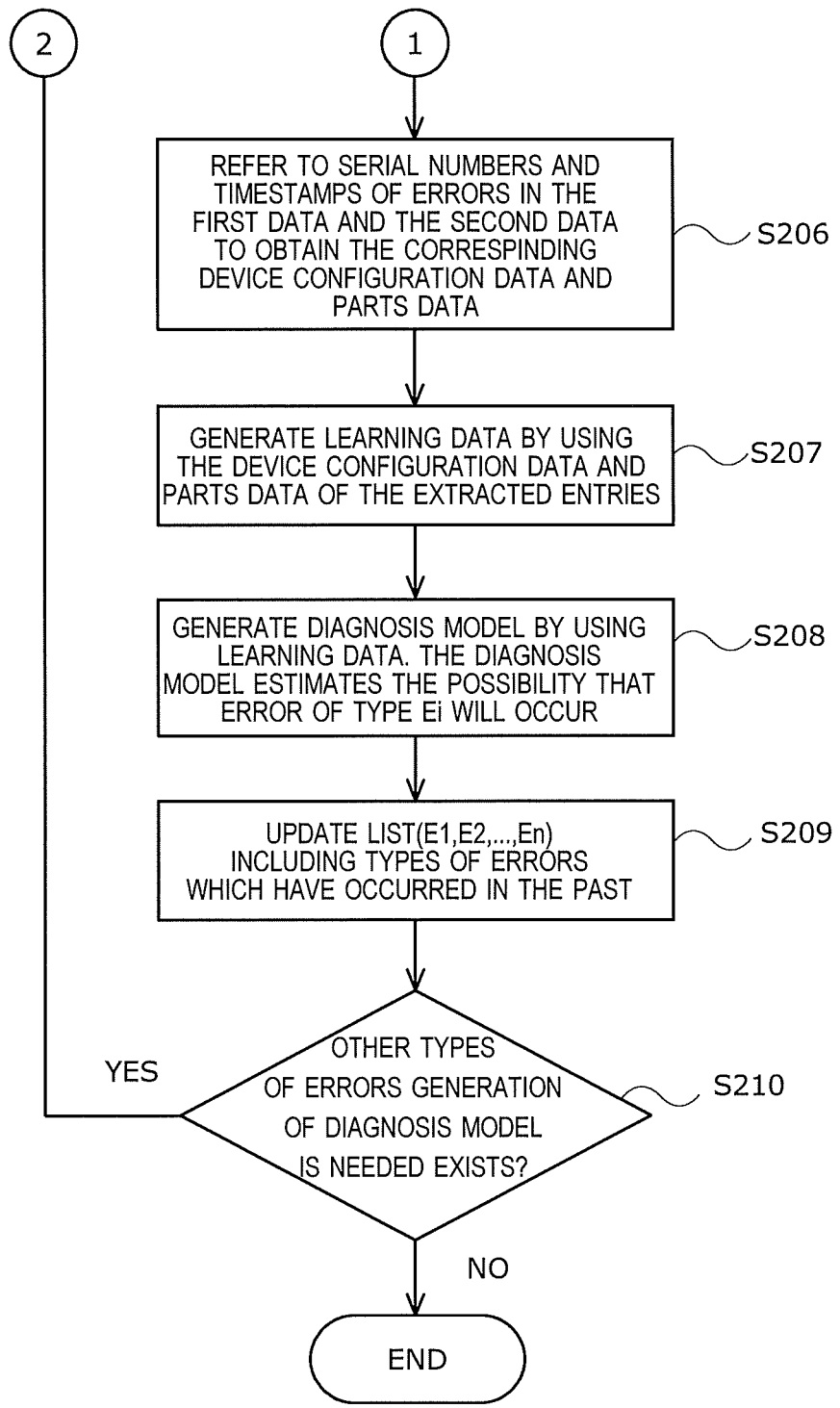
FIG. 19 is a flowchart describing an example of a diagnosis model generation process.

Next, details of the diagnosis model generation process are described. FIG. 18 and FIG. 19 are flowcharts describing an example of a diagnosis model generation process. In the following, the process is described with references to FIG. 18 and FIG. 19. The processes of steps S201-S207 can be executed by the data generator 15.

First, the data generator 15 refers to the error history database 12 to specify a list including types of errors ($E_1$, $E_2$, . . . , $E_n$) which occurred in the past, to specify the type of error $E_i$ generation of diagnosis model is required (step S201). For example, if diagnosis models for each of the types of errors which occurred in the past need to be prepared, the type of error $E_i$ a diagnosis model has not been generated yet can be specified. Also, diagnosis models for types of errors specified by the administrator via the management interface 22 can be generated.

It is possible to determine the type of error $E_i$ the generation of diagnosis model is necessary based on the number of occurrences within a certain period. For example, if the number of occurrences is greater than a threshold value for a specific type of error, it is determined that the generation of the diagnosis model for the corresponding type of error is necessary. Also, if the ratio of a certain type of error within all the error cases exceeds a threshold, it could be determined that the diagnosis model for the corresponding type of error needs to be generated. Also, if a certain period has lapsed since the last time a diagnosis model for a certain type of error has been generated, the diagnosis model for the corresponding type of error could be generated again.

Next, the data generator 15 sets the type of error $E_i$ which is going to be diagnosed in the generated diagnosis model to positive examples (step S202). Errors of types other than the type of error $E_i$ are set as the negative examples. The data generator 15 refers to the error history database 12 to extract entries which are set as the positive examples (step S203). The set of extracted entries corresponding to positive examples are called the first data. The data generator 15 saves the first data to the storage 16.

Then, the data generator 15 refers to the error history database 12 to calculate the composition ratio of each type of error for entries which are set as negative examples (entries for errors other than type $E_i$) in the error history data of the error history database 12 (step S204). For example, suppose that the number of types of errors is n=5. Also suppose that the entries with the type of error $E_2$ are set as the positive examples. In this case, the entries with the types of error $E_1$, $E_3$, $E_4$ and $E_5$ are set as the negative examples. If the number of entries (occurrences) of types of error $E_1$, $E_3$, $E_4$ and $E_5$ are 250, 300, 150 and 200 respectively, the composition ratio of each type of error in the negative examples is 5:6:3:4.

Next, for the entries set as negative examples, the data generator 15 selects parts of the entries for each type of error (which does not include type $E_i$) based on the calculated composition ratio (step S205). The process executed in step S205 is explained by using the example above. For example, suppose that for the positive examples, the number of entries (occurrences) is 300. Here, all the 300 entries correspond to the type of error $E_2$. For the negative examples, the number of entries (occurrences) with types of error $E_1$, $E_3$, $E_4$ and $E_5$ is 900 in total. Suppose the number of positive examples (first data) and the number of negative examples in the learning data need to be set to approximately equal values. Then, ⅓ of the 900 entries set as negative examples in the error history data are selected. In step S205, parts of the entries for each type of error are selected so that the aforementioned composition ratio, 5:6:3:4 is maintained, even after the selection process is executed.

For example, suppose that 83 entries with type of error $E_1$, 100 entries with type of error $E_3$, 50 entries with type of error $E_4$ and 66 entries with type of error $E_5$ are selected. Then, the number of entries set as negative examples would be 299, which is close to the number of entries (300) set as positive examples in the first data. Also, regarding the negative examples, the composition ratio for each type of error would be close to the composition ratio for each type of error in the error history data, even after the selection process.

The set of entries selected in step S205 is called the second data. The data generator 15 saves the second data to the storage 16. In the example above, parts of the entries for each type of error were selected for the negative examples, to make the ratio between the number of positive examples and the number of the negative examples approximately 1:1 in the learning data. The data generator 15 generates learning data by using the entries of the first data and the entries of the second data. Thus, the number of entries in the first data is equal to the number of positive examples in the learning data. Also, the number of entries in the second data is equal to the number of negative examples in the learning data.

However, the ratio between the number of positive examples and the number of the negative examples in the learning data can be different. For example, the ratio between the number of positive examples and the number of the negative examples can be approximately 2:1, 3:1 or 1:2. As long as the proportion of positive examples in the learning data is greater than the proportion of positive examples in the error history data, any ratio can be used.

The number of entries which need to be selected for each type of error during the generation of the second data can be formulated. For example, if the number of negative examples in the error history data is N and the number of entries with a type of error j within the negative examples is $n_j$, the proportion of entries with type of error j is $P_j = n_j/N$. If the number of entries set as positive examples is M, the number of entries $s_j$ selected from entries with type of error j can be expressed according to the following equation (1).

$$s_j = \begin{cases} [P_j] \times \alpha \times M (P_j \text{mod} 1 \geq 0.5) \\ [P_j] \times \alpha \times M (P_j \text{mod} 1 < 0.5) \end{cases} \quad (1)$$

Here, $\alpha$ is the ratio obtained by dividing the number of entries in the second data to the number of entries in the first data. If the ratio between the number of positive examples and the number of negative examples in the learning data is set to 1:1, α=1 holds. If the ratio between the number of positive examples and the number of negative examples in the learning data is set to 1:2, α=0.5 holds.

In above, the number of entries selected for each type of error was calculated based on the number of entries for each type of error in the error history data. However, other criteria can be used for calculating the number of selected entries. For example, the number of selected entries can be calculated based on the number of multi-function peripherals each type of error occurred. Also, it is possible to execute the selection process ensuring that the numbers of entries corresponding to each type of error are approximately equal in the first data. For example, by selecting the entries randomly from the error history data, it is possible to set the ratio between the number of positive examples and the number of negative examples in the second data to a value close to the configured value α.

Next, the data generator 15 refers to the serial numbers and timestamps of errors in the first data and the second data to obtain the corresponding device configuration data and parts data from the configuration database 13 (step S206). In step S206, it is possible to select the entries of the device configuration data and parts data obtained at a time which is closest to the time of error occurrence (timestamp) in the first data and the second data. Also, it is possible to select the entries of the device configuration data and parts data with timestamps which have the shortest lapse of time from the timestamp of the first data and the timestamp of the second data. If the device configuration data and the parts configuration data are obtained frequently from each multi-function peripheral, it is possible to obtain accurate information on the configuration of devices and expendable supplies during the occurrences of errors.

Then, learning data is generated by using the device configuration data and parts data in the obtained entries (step S207). The data generator 15 can add the "entry type" item (column) to the learning data (for example, the column 17$d$ of table 17$a$ in FIG. 8). Thereby, it is possible to determine whether each entry in the learning data is set as a positive example or a negative example. The data generator 15 can execute the preprocessing process of learning data. For example, the data generator 15 can remove letter characters and symbol characters from the learning data. Also, the data generator 15 can replace letter characters and symbol characters in the learning data to numerical characters (values). The data generator 15 can also adjust the values in the learning data. FIG. 8 to FIG. 10 described above is an example of learning data before the preprocessing process.

For example, the data generator 15 can convert the "30%" in the learning data to "0.3". The data generator 15 can convert characters to numbers, according to certain rules. For example, "cardboard" can be converted to "2". "Regular" can be converted to "1".

As mentioned above, the "entry type" is used as the teaching signal during the learning process of the diagnosis model. Therefore, if the values of the "entry type" are not in numbers (numerical characters), conversion of data is necessary. For example, if the value of "entry type" is "target error", the value can be set to "1", indicating that the entry is a positive example. If the value of "entry type" is "non-target error", the value can be set to "0", indicating that the entry is a negative example.

Next, the model generator 20 generates a diagnosis model which estimates the possibility that error of type $E_i$ will occur (step S208). For example, the model generator 20 executes supervised learning to generate a diagnosis model. After the model generator 20 generates a diagnosis model, the diagnosis model can be saved along with information indicating the type of error which is going to be diagnosed to the model database 19.

Then, the model generator 20 accesses the error history database 12 to update the list including types of errors which have occurred in the past (S209). For example, if it is found that errors of types which have not occurred in the past have occurred recently, the corresponding type of error is added to the list. Also, data including the frequency of each type of error, the number of multi-function peripheral each type of error occurred, information of the types of errors diagnosis models are generated and the timestamp of the generated diagnosis model can be updated.

Figure 23:
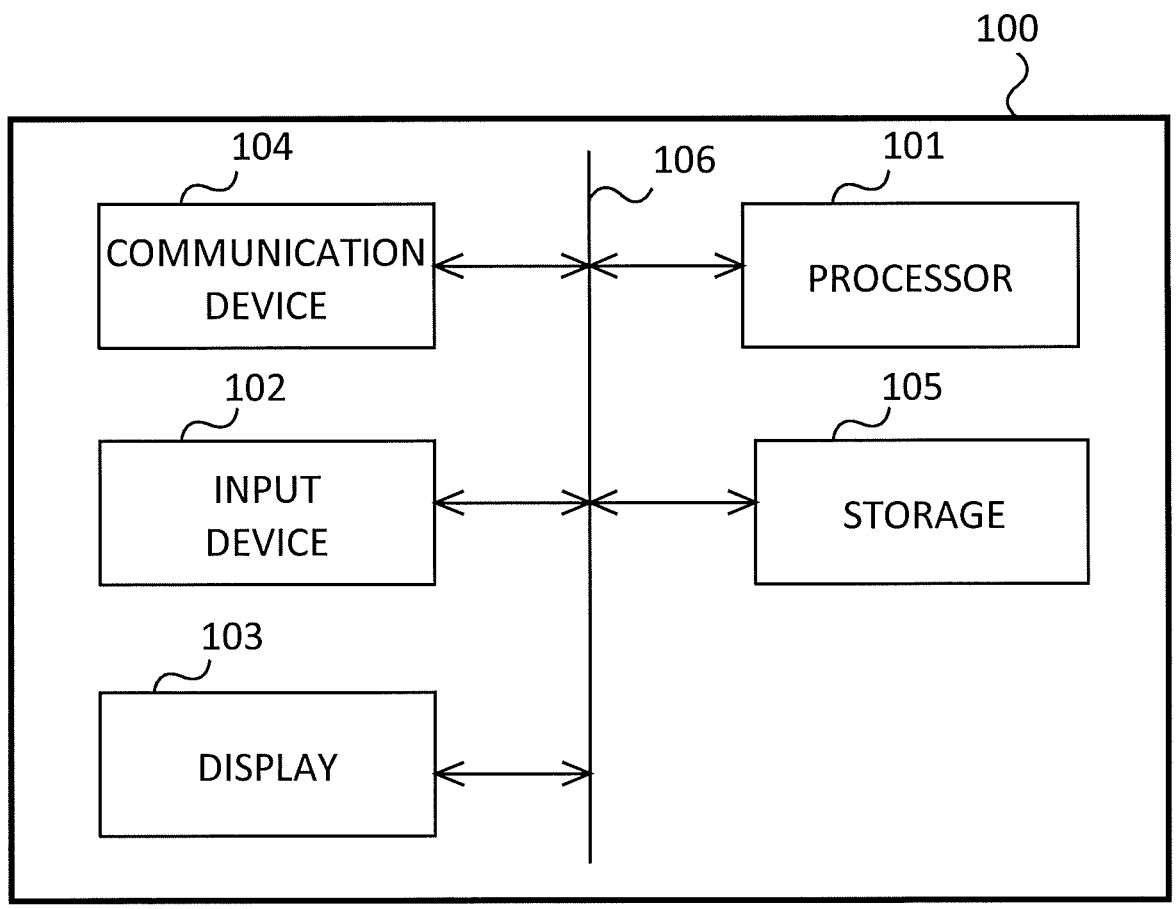
FIG. 23 is a block diagram describing an example of an information processing device in accordance with a second embodiment.

If the list of errors is updated, it is confirmed whether there are other types of errors generation of diagnosis models is required (step S210). It is possible to use the criteria mentioned in the description of step S201 to determine whether the generation of diagnosis models is necessary for each type of error. If there are no other types of errors generation of diagnosis models is necessary, the process of FIG. 18 and FIG. 23 is finished (NO in step S210). If there are other types of errors generation of diagnosis models is required (YES in step S210), the processes of step S210 and the later steps are executed again.

Figure 20:
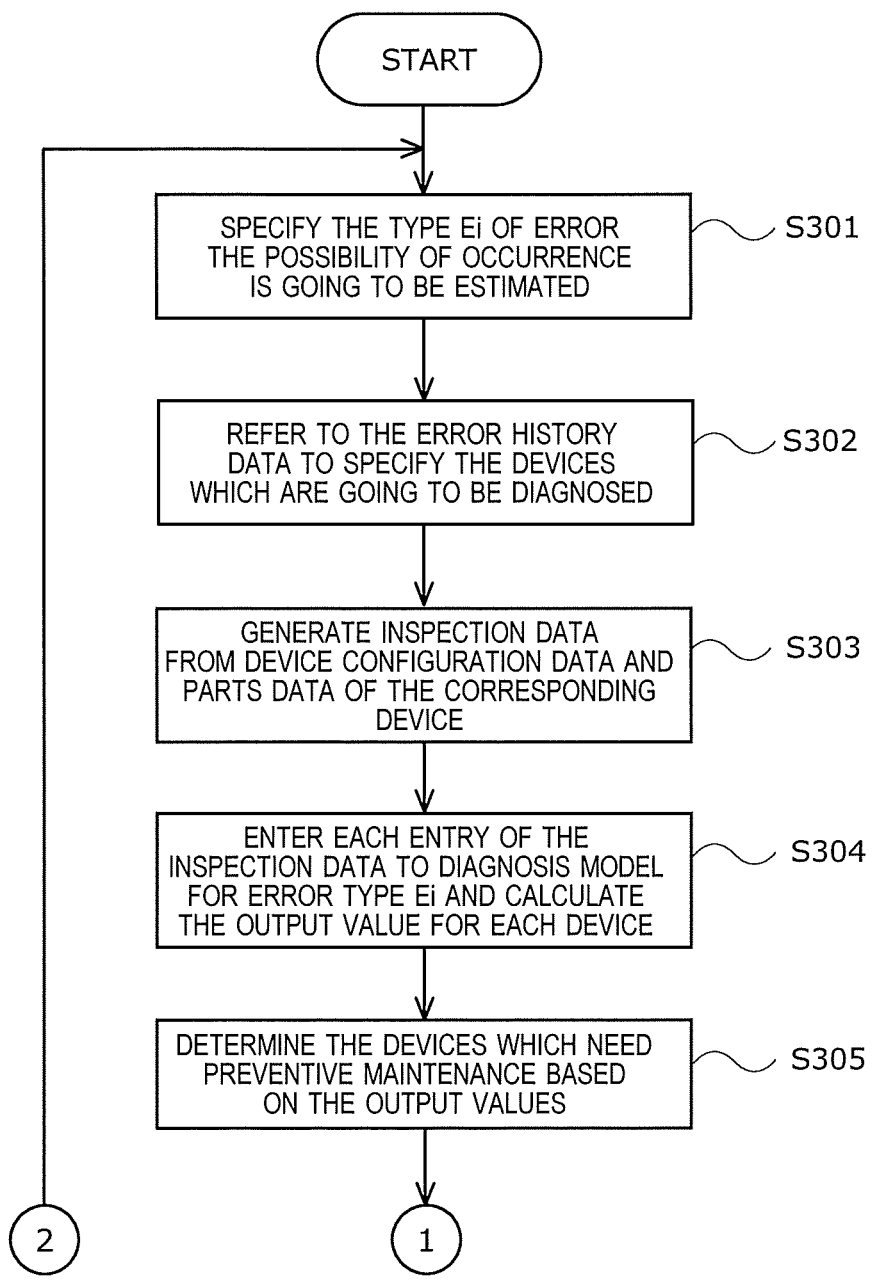
FIG. 20 is a flowchart describing an example of a diagnosis process.
Figure 21:
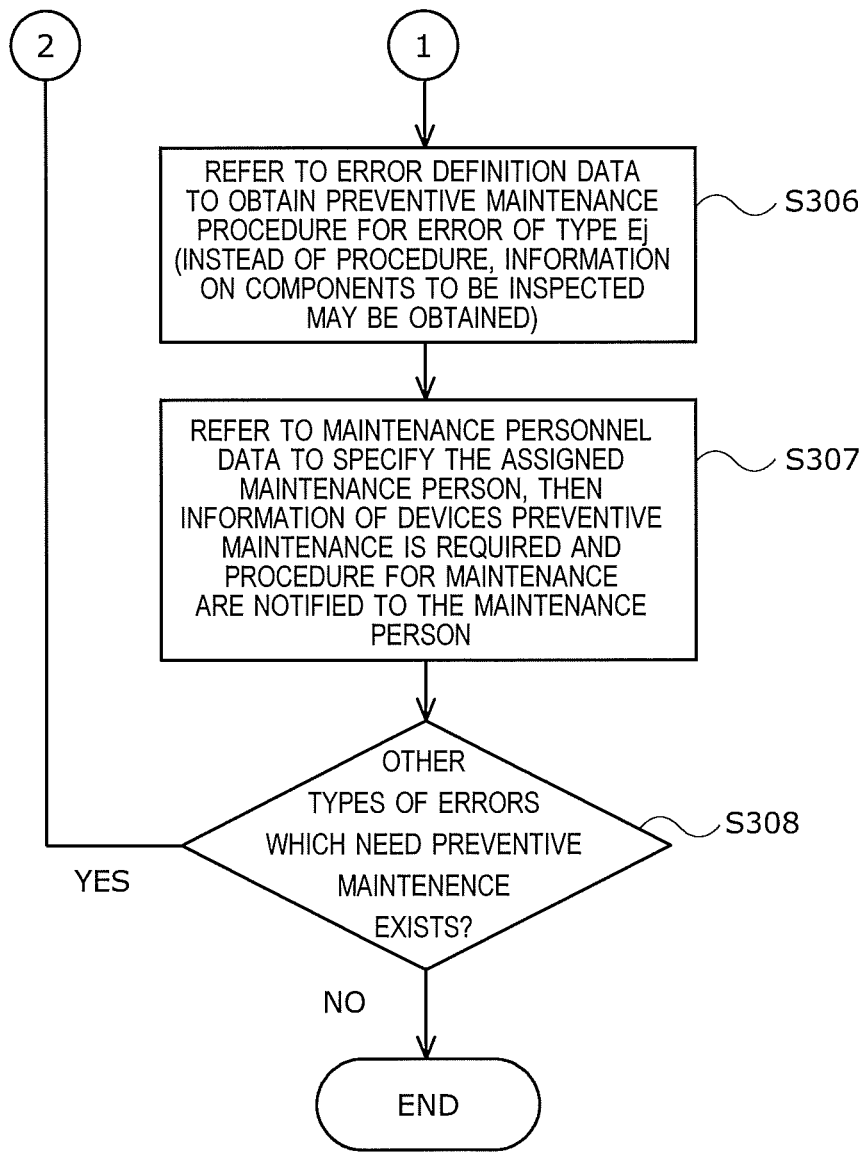
FIG. 21 is a flowchart describing an example of a diagnosis process.

Next, details of the diagnosis process are described. FIG. 20 and FIG. 21 are flowcharts describing an example of a diagnosis process. In the following, the process is described with reference to FIG. 20 and FIG. 21.

First, the selector 21 specifies the type $E_1$ of error the possibility of occurrence is going to be estimated (step S301). The administrator can specify the type of error which is going to be diagnosed from the management interface 22. Also, the administrator can generate a diagnosis schedule, specifying the periods or timings when diagnosis process corresponding to each type of error is executed. The selector 21 can access the error history data in the error history database 12 to obtain information on the occurrence of each type of error. Then, the selector 21 can determine the type of error which is going to be diagnosed. For example, if the number of errors of a specific type observed during a certain period of time is exceeding a threshold value, the selector 21 can determine that the diagnosis process for the corresponding type of error is necessary. Also, if an increasing trend is observed for a specific type of error, the selector 21 can determine that the diagnosis process for the corresponding type of error is required.

Next, the selector 21 can refer to the error history data to specify the devices which are going to be diagnosed (step S302). For example, multi-function peripherals which are not in "error states" of the selected type of error can be specified in step S302. Also, the multi-function peripherals errors the diagnosed type of error has not occurred in the past can be specified. If the number of multi-function peripherals subject to preventative maintenance is large, the amount of calculation and processing time may expand. Thus, it is possible to divide the multi-function peripherals into a plurality of sets. Then, the diagnosis process can be executed for each of the generated sets. Also, all the multi-function peripherals can be specified in step S302, without limitations.

Then, the selector 21 refers to the configuration database 13 to generate inspection data based on the device configuration data and the parts data corresponding to the specified devices (step S303). The selector 21 can execute the preprocessing process to ensure that the explanatory variables (feature values) are numbers (numeric characters). The preprocessing executed in step S303 is similar to the process executed in step S207 (generation of learning data).

The selector 21 refers to the model database 19 to obtain data of the diagnosis model which predicts the possibility that errors of type $E_i$ will occur. Then, the selector 21 enters each entry of the inspection data to diagnosis model for error type $E_i$. The diagnosis model calculates the output value for each device (multi-function peripheral) (step S304). As mentioned in the descriptions of FIG. 11 to FIG. 13, each entry (row) of the inspection data, excluding the serial number (the identifier) are sets of explanatory variables for each multi-function peripheral. Therefore, if each entry (row) of the inspection data is entered to the diagnosis model, output values for each multi-function peripheral could be calculated. The multi-function peripheral corresponding to the output value can be specified by referring to the serial numbers in the inspection data.

Next, the selector 21 determines the devices (multi-function peripherals) which need preventative maintenance based on the output values (step S305). For example, the selector 21 can compare the output value obtained from each entry in the inspection data with a threshold value. The multi-function peripherals corresponding to the entries output values are greater than the threshold value can be selected as the subjects of preventative inspection. If the diagnosis model executes classifications and each entry is classified to either of the classes or clusters, the multi-function peripherals classified to specific classes or clusters can be selected as subjects of preventative inspection.

Then, the selector 21 refers to the error definition data in the error history database 12 to obtain the preventative maintenance procedure for the error type $E_i$ (step S306). The preventative maintenance procedure is the procedure the maintenance person should follow. In step S306, the selector 21 may obtain information on the components to be inspected instead of the preventative maintenance procedure.

Figure 22:
FIG. 22 is a diagram illustrating an example of a screen which requests preventative maintenance.

Next, the notification device 23 refers to the maintenance personnel data in the maintenance personnel database 14 to specify the maintenance person assigned to the device (multi-function peripheral). Then, the notification device notifies the information of devices preventative maintenance is required and the procedure for maintenance to the maintenance person (step S307). FIG. 22 is an example of a screen (screen 33) displayed on the communication terminal used by the maintenance person during step S307. The screen 33 in FIG. 22 requests the maintenance person to start preventative maintenance for a specific multi-function peripheral.

In the top half of screen 33, the date of notification, the name of the maintenance person, the location where the multi-function peripheral is installed, the model of the multi-function peripheral, the serial number of the multi-function peripheral and the component which should be inspected are displayed. By referring to the information above, the maintenance person can immediately specify the multi-function peripheral inspection is required.

In the example of FIG. 22, the document feeder is specified as the component which should be inspected. In the bottom of screen 33, the procedure the maintenance person should follow during preventative maintenance is displayed. In the example of FIG. 22, it is instructed that a diagnosis command should be executed. Depending on the return code obtained by the diagnosis command, different tasks need to be performed. In the screen 33, the procedure is displayed by text. However, the procedure can be explained by using photographs or illustrations. Also, the procedure can be explained to the maintenance person by voice messages.

Preventative maintenance is common for various types of devices. Preventative maintenance prevents the occurrence of failures and incidents, improving the safety of users and keeping the continuity of customers' business. However, if the number of devices becomes large, devices which are most likely to have failures or incidents can be selected as the devices preventative maintenance is required. In other words, higher priorities assigned for the maintenance of certain devices. To select devices which are subject to preventative maintenance within a limited period of time, machine learning methods can be applied to the collected data to specify the devices possibility that failures or incidents will occur is higher.

However, if the operating times of the devices become longer, the types of occurring errors would increase (for example, hundreds, thousands or even greater) and the data size of the logs (operation history) would expand. Therefore it will become difficult to generate diagnosis models which provide the possibility each type of error occurs, accurately. If learning data is generated directly from the collected logs, the proportion of entries corresponding to the type of error which is going to be diagnosed (positive examples) would become too small. Thus, the learning data would become unbalanced. If unbalanced learning data is used for learning, the influence of the negative examples would become too large, affecting the accuracy of the generated diagnosis model.

Therefore, in the diagnosis system according to the embodiment, preprocessing is executed to ensure that the proportion of entries corresponding to the type of error which is going to be diagnosed (positive examples) is greater than the original log data. Specifically, it is ensured that the proportion of the entries corresponding to the type of error the possibility that a specific type of error will occur is estimated (positive examples) is greater than the entries of the corresponding type of error in the error history data. Only parts of the entries are selected for the other types of errors (negative examples). Thereby, the proportion of negative examples in the learning data will not become too large.

By applying the aforementioned preprocessing to the data, it is possible to select the devices preventative maintenance is required for each of the types of error with higher accuracy. By using the method of the embodiment, it is possible to reduce the storage space necessary to store learning data and generate the diagnosis models. Also, the consumption of computing resources can be reduced, while improving the accuracy of the generated diagnosis model.

Second Embodiment

In the second embodiment, the hardware configurations of the log collecting device 4a and the diagnosis device 4b are described. For example, the log collecting device 4a and the diagnosis device 4b in the first embodiment are configured by using a computer 100.

Examples of the computer 100 include various information processing devices including servers, client devices, microprocessors of embedded devices, tablets, smartphones, feature phones and personal computers. The computer 100 may be implemented by VMs (virtual machines) or containers.

FIG. 23 is a diagram describing a hardware configuration example of the information processing device. The computer 100 in FIG. 23 includes a processor 101, an input device 102, a display 103, a communication device 104 and a storage 105. The processor 101, the input device 102, the display 103, the communication device 104 and the storage 105 are connected to each other by a bus 106.

The processor 101 is an electric circuit including the controller and arithmetic unit of the computer 100. It is possible to use general purpose processors, central processing units (CPUs), microprocessors, digital signal processors, controllers, microcontrollers, state-machines, ASICs, FPGAs, PLDs or a combination of the above as the processor 101.

The processor 101 executes arithmetic operations by using data or programs provided from devices connected via the bus 106 (for example, the input device 102, the communication device 104 and the storage 105). Also, the processor 101 transmits the calculated results and control signals to the devices connected via the bus 106 (for example, the display 103, the communication device 104 and the storage 105). Specifically, the processor 101 executes the OS (the operation system) of the computer 100 and diagnosis programs. Also, the processor controls various devices which configure the computer 100.

By using the diagnosis program, it is possible to make the computer 100 operate as the aforementioned log collecting device 4a or the diagnosis device 4b. The program is stored in non-transitory storage medium which is readable by the computer. Examples of the storage medium include optical discs, magnetic discs, magnetic tapes, flash memories and semiconductor memory. However, the type of storage medium is not limited. When the processor 101 executes the diagnosis program, the computer 100 operates as the log collecting device 4a or the diagnosis device 4b.

The input device 102 is a device for entering information to the computer 100. Examples of the input device 102 include a keyboard, a mouse and a touch panel. However, the type of device is not limited. By using the input device 102, the users can change the operation settings of the system. Also, the users can configure the timing when the diagnosis models are generated by using the input device 102. The users can configure the timing when the diagnosis process is executed by using the input device 102. Instructions to start the generation of diagnosis models and instructions to start the diagnosis process can be entered via the input device 102.

The display 103 displays graphics and videos. Examples of the display 103 include a LCD (liquid crystal display), CRT (cathode ray tube) or an organic electroluminescence display. However, the type of displays used is not limited. Various configuration screens, contents of each database, information of the learned models and results of diagnosis can be presented on the display 103.

The communication device 104 enables the computer 100 to communicate with external devices via wireless or wired communication mediums. Examples of the communication device 104 include Network Interface Cards, communication modules, hubs and routers. However, the type of device is not limited. The computer 100 may collect configuration data from remote plants, factories and buildings via the communication device 104. Also, if the computer 100 are servers installed in data centers and machine rooms, the computer 100 may accept instructions transmitted from remote communication terminals and transmit contents to be displayed in remote communication terminals, via the communication device 104.

The storage 105 saves the operating system of the computer 100, the program, data necessary to execute the program and data generated by the program. The storage 105 includes the main storage device and the external storage device. Examples of the main storage device include RAM, DRAM and SRAM. However, the type of device used as the main storage device is not limited. Also, examples of the external storage device include HDD, optical discs, flash memory and magnetic tapes. However, the type of device used as the external storage is not limited. The aforementioned error history database 12, configuration database 13, maintenance personnel database 14, learning database 17, inspection database 18 and the model database 19 can be configured on the storage 105. The above databases may be configured on external servers or external storage.

The computer 100 may include a plurality of processors 101, input devices 102, displays 103, communication devices 104 and storage 105. The computer 100 may be connected to peripheral devices such as printers or scanners.

The log collecting device 4a and the diagnosis device 4b may be configured with a single computer 100. The log collecting device 4a and the diagnosis device 4b may be configured with a plurality of computers which are connected to each other.

The programs may be stored in the storage 105 of the computer 100. The programs may be stored in the external storage. The programs may be uploaded to the Internet. By installing the programs to the computer 100, the features of the log collecting device 4a or the diagnosis device 4b become executable.

The terms used in the embodiments should be interpreted broadly. For example, the term "processor" may include a general-purpose processor, a central processor (CPU), a microprocessor, a digital signal processor (DSP), a controller, a micro-controller, and a state machine. Depending on situations, the "processor" may indicate an application specific integrated circuit, a field programmable gate array (FPGA), a programmable logic circuit (PLD), and the like. The "processor" may indicate a combination of processing devices such as a plurality of microprocessors, a combination of a DSP and a microprocessor, and one or more microprocessors cooperating with a DSP core.

As another example, the term "memory" may include any electronic component capable of storing electronic information. The "memory" can indicate a random access memory (RAM), a read only memory (ROM), a programmable read only memory (PROM), an erasable programmable read only memory (EPROM), an electrically erasable PROM (EEPROM), a nonvolatile random access memory (NVRAM), a flash memory, and a magnetic or optical data storage. The data saved in the devices mentioned above can be read by a processor. If the processor performs reads, writes or both reads and writes to the memory, the memory can be considered to be communicating electrically with the processor. The memory can be integrated with the processor. In such cases as well, the memory can be considered as communicating electrically with the processor.

The term "storage device" or "storage" may include any device that can store data using magnetic technology, optical technology, or nonvolatile memory. For example, the storage can be a HDD, an optical disk, a SSD, or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An information processing device comprising:
    a storage configured to store configuration data of a plurality of devices and error history data including a plurality of entries each with a type of error; and
    a processing circuit configured to:
        extract the entries with a specific type of error which are positive examples,
        extract remaining entries which are negative examples,
        select a part of the negative examples with each type of error,
        generate learning data based on the positive examples, selected negative examples, and the configuration data at a time when the specific type of error occurred, and
        generate a diagnosis model for estimation of possibility the specific type of error occurs by using the learning data.

2. The information processing device according to claim 1, wherein
    the processing circuit is configured to select the negative examples ensuring that composition of the negative examples with each type of error in the generated learning data is approximately equal to the composition of the entries with each type of error in the error history data.

3. The information processing device according to claim 2, wherein
    the processing circuit is configured to calculate the composition of the negative examples with each type of error based on number of entries with each type of error in the error history data.

4. The information processing device according to claim 2, wherein
    the processing circuit is configured to calculate the composition of the negative examples with each type of error, based on number of the errors in the devices.

5. The information processing device according to claim 1, wherein
    the processing circuit is configured to select parts of the negative examples with each type of error ensuring that the ratio between the number of the positive examples and the number of the negative examples is approximately 1:1 in the generated learning data.

6. The information processing device according to claim 1, wherein
    the processing circuit is configured to generate inspection data based on the configuration data and select the device inspection is required based on output values obtained by entering the inspection data to the diagnosis model.

7. The information processing device according to claim 6, wherein
    the processing circuit is configured to notify information on the device maintenance is required and components of the device the maintenance is need to an external communication terminal.

8. The information processing device according to claim 7, wherein
    the processing circuit is configured to notify procedures which should be followed during maintenance of the device to the external communication terminal.

9. The information processing device according to claim 1, wherein
    the devices are image forming devices and the configuration data includes at least firmware versions, revision of hardware, information on optional parts and expendable supplies.

10. A non-transitory storage medium having a computer program stored therein configured to enable a computer to execute the processes of:
    accessing error history data including a plurality of entries each with a type of error, stored in a storage;
    extracting the entries with a specific type of error which are positive examples;
    extracting remaining entries which are negative examples;
    selecting a part of the negative examples with each type of error;
    accessing configuration data of a plurality of devices, stored in the storage;
    generating learning data based on the positive examples, the negative examples, and configuration data at a time when the specific type of error occurred; and
    generating a diagnosis model for estimation of possibility the specific type of error occurs by using the learning data.

11. The non-transitory storage medium according to claim 10, further comprising the step of:
    selecting parts of the entries with each type of error in the negative examples ensuring: composition of the entries with each type of error in the negative examples of the generated learning data is approximately equal to the composition of the entries with each type of error in the error history data; and the ratio between the number of the entries set as the positive examples and the number of the entries set as the negative examples is approximately 1:1 in the generated learning data.

12. An information processing method comprising the steps of:
    accessing error history data including a plurality of entries each with a type of error, stored in a storage;
    extracting the entries with a specific type of error which are positive examples;
    extracting remaining entries which are negative examples;
    selecting a part of the negative examples with each type of error;
    accessing configuration data of a plurality of devices, stored in the storage;
    generating learning data based on the positive examples, the negative examples, and configuration data at a time when the specific type of error occurred; and
    generating a diagnosis model for estimation of possibility the specific type of error occurs by using the learning data.

13. The information processing method according to claim 12, further comprising the step of:
    extracting parts of the entries with each type of error in the negative examples ensuring: composition of the entries with each type of error in the negative examples of the generated learning data is approximately equal to the composition of the entries with each type of error in the error history data; and the ratio between the number of the entries set as the positive examples and the number of the entries set as the negative examples is approximately 1:1 in the generated learning data.

* * * * *